United States Patent
Kawana et al.

(10) Patent No.: US 11,462,502 B2
(45) Date of Patent: Oct. 4, 2022

(54) METAL PASTE FOR JOINTS, ASSEMBLY, PRODUCTION METHOD FOR ASSEMBLY, SEMICONDUCTOR DEVICE, AND PRODUCTION METHOD FOR SEMICONDUCTOR DEVICE

(71) Applicant: HITACHI CHEMICAL COMPANY, LTD., Tokyo (JP)

(72) Inventors: Yuki Kawana, Tokyo (JP); Hideo Nakako, Tokyo (JP); Motohiro Negishi, Tokyo (JP); Dai Ishikawa, Tokyo (JP); Chie Sugama, Tokyo (JP); Yoshinori Ejiri, Tokyo (JP)

(73) Assignee: Showa Denko Materials Co., Ltd., Tokyo (JP)

( * ) Notice: Subject to any disclaimer, the term of this patent is extended or adjusted under 35 U.S.C. 154(b) by 489 days.

(21) Appl. No.: 16/493,507

(22) PCT Filed: Jan. 18, 2018

(86) PCT No.: PCT/JP2018/001409
§ 371 (c)(1),
(2) Date: Sep. 12, 2019

(87) PCT Pub. No.: WO2018/168186
PCT Pub. Date: Sep. 20, 2018

(65) Prior Publication Data
US 2020/0075528 A1 Mar. 5, 2020

(30) Foreign Application Priority Data
Mar. 15, 2017 (JP) .............................. JP2017-050088

(51) Int. Cl.
*H01L 21/02* (2006.01)
*H01L 23/00* (2006.01)
(Continued)

(52) U.S. Cl.
CPC .............. *H01L 24/29* (2013.01); *B22F 1/068* (2022.01); *B22F 1/107* (2022.01); *B22F 7/062* (2013.01);
(Continued)

(58) Field of Classification Search
None
See application file for complete search history.

(56) References Cited

U.S. PATENT DOCUMENTS

2017/0140847 A1* 5/2017 Kamikoriyama ........ H05K 1/09
2018/0111218 A1* 4/2018 Naito ................... B23K 1/0004

FOREIGN PATENT DOCUMENTS

JP 3736797 B2 1/2006
JP 4928639 B2 5/2012
(Continued)

OTHER PUBLICATIONS

R.Khazaka et al., "Review on Joint Shear Strength of Nano-Silver Paste and Its Long-Term High Temperature Reliability", Journal of Electronic Materials, vol. 43, No. 7, 2014, p. 2459-p. 2466.

*Primary Examiner* — Alexander S Thomas
(74) *Attorney, Agent, or Firm* — Fitch, Even, Tabin & Flannery, LLP

(57) ABSTRACT

Provided is a metal paste for joints, containing: metal particles; and linear or branched monovalent aliphatic alcohol having 1 to 20 carbon atoms, in which the metal particles include sub-micro copper particles having a volume average particle diameter of 0.12 μm to 0.8 μM.

20 Claims, 8 Drawing Sheets

(51) Int. Cl.
B22F 7/06 (2006.01)
B22F 1/068 (2022.01)
B22F 1/107 (2022.01)

(52) U.S. Cl.
CPC .......... *H01L 24/83* (2013.01); *B22F 2301/10* (2013.01); *B22F 2301/255* (2013.01); *B22F 2301/30* (2013.01); *H01L 2224/2926* (2013.01); *H01L 2224/2928* (2013.01); *H01L 2224/29211* (2013.01); *H01L 2224/29216* (2013.01); *H01L 2224/29218* (2013.01); *H01L 2224/29224* (2013.01); *H01L 2224/29239* (2013.01); *H01L 2224/29244* (2013.01); *H01L 2224/29247* (2013.01); *H01L 2224/29249* (2013.01); *H01L 2224/29255* (2013.01); *H01L 2224/29257* (2013.01); *H01L 2224/29264* (2013.01); *H01L 2224/29266* (2013.01); *H01L 2224/29269* (2013.01); *H01L 2224/29271* (2013.01); *H01L 2224/29347* (2013.01); *H01L 2224/3226* (2013.01); *H01L 2224/8384* (2013.01); *H01L 2924/0103* (2013.01); *H01L 2924/01004* (2013.01); *H01L 2924/0105* (2013.01); *H01L 2924/01013* (2013.01); *H01L 2924/01022* (2013.01); *H01L 2924/01024* (2013.01); *H01L 2924/01025* (2013.01); *H01L 2924/01026* (2013.01); *H01L 2924/01027* (2013.01); *H01L 2924/01028* (2013.01); *H01L 2924/01029* (2013.01); *H01L 2924/01042* (2013.01); *H01L 2924/01046* (2013.01); *H01L 2924/01047* (2013.01); *H01L 2924/01078* (2013.01); *H01L 2924/01079* (2013.01); *H01L 2924/01082* (2013.01)

(56) References Cited

FOREIGN PATENT DOCUMENTS

| JP | 5006081 | B2 | | 8/2012 | |
|----|---------|----|--|--------|--|
| JP | 2014-167145 | A | | 9/2014 | |
| JP | 2016203237 | A | * | 12/2016 | .............. B22F 7/064 |
| JP | 6060199 | B2 | | 1/2017 | |
| TW | 201611668 | A | | 3/2016 | |
| WO | 2013/090570 | A1 | | 6/2013 | |
| WO | 2016/031619 | A1 | | 3/2016 | |
| WO | 2016/140351 | A1 | | 9/2016 | |

* cited by examiner (a)

(b)

(a)

(b)

(c)

(a)

(b)

METAL PASTE FOR JOINTS, ASSEMBLY, PRODUCTION METHOD FOR ASSEMBLY, SEMICONDUCTOR DEVICE, AND PRODUCTION METHOD FOR SEMICONDUCTOR DEVICE

CROSS-REFERENCE TO RELATED APPLICATIONS

This application is a U.S. national phase application filed under 35 U.S.C. § 371 of International Application No. PCT/JP2018/001409, filed Jan. 18, 2018, designating the United States, which claims priority from Japanese Patent Application No. 2017-050088, filed Mar. 15, 2017, which are hereby incorporated herein by reference in their entirety.

TECHNICAL FIELD

The present invention relates to a metal paste for joints, an assembly, a production method for an assembly, a semiconductor device, and a production method for a semiconductor device.

BACKGROUND ART

When a semiconductor device is produced, various joining materials are used in order to join a semiconductor element and a lead frame and the like (a support member) together. In the semiconductor device, a high-melting point lead solder has been used as the joining material for joining a power semiconductor, an LSI, or the like that is operated at a high temperature of higher than or equal to 150° C. Recently, an operation temperature increases to be close to a melting point of the high-melting point lead solder, in accordance with higher capacity and space saving of the semiconductor element, and thus, it is difficult to ensure connection reliability. On the other hand, a joining material not containing lead is required in accordance with tightening of RoHS regulation.

Until now, the joints of a semiconductor element using materials other than the lead solder have been considered. For example, in Patent Literature 1 described below, a technology is proposed in which silver nanoparticles are subjected to low-temperature sintering, and thus, a sintered silver layer is formed. It is known that such sintered silver has high connection reliability with respect to a power cycle (refer to Non Patent Literature 1).

A technology is also proposed in which copper particles are sintered as another material, and thus, a sintered copper layer is formed. For example, in Patent Literature 2 described below, a paste for joints containing cupric oxide particles and a reducing agent is disclosed as a joining material for joining a semiconductor element and an electrode together. In addition, in Patent Literature 3 described below, a joining material containing copper nanoparticles, any one or both of copper micro particles and copper sub-micro particles is disclosed.

Incidentally, in a case where a residual thermal stress between the semiconductor element and the support member is large, a characteristic change due to thermal strain with respect to the semiconductor element, and a damage such as a crack with respect to the semiconductor element, the joining material, and the support member occur. For this reason, the residual thermal stress between the semiconductor element and the support member causes a decrease in a yield ratio and a decrease in long-term reliability. On the other hand, in general, it is possible to reduce the residual thermal stress between the semiconductor element and the support member as a temperature at the time of joining the semiconductor element and the support member together (a joining temperature) decreases. In addition, in a case where the joining temperature is low, it is possible to reduce the energy for production. For this reason, it is preferable that the joining temperature between the semiconductor element and the support member is low. In particular, in a case where the joining temperature is lower than or equal to 250° C., it is possible to apply an organic substrate such as a glass epoxy substrate as the support member, and it is possible to apply the organic substrate to a logic, a sensor, a passive component, and the like.

A method using an alloy having a low melting point in a solder (refer to Patent Literature 4), a method of increasing a melting point by diffusing a dissimilar metal in a solder to be an alloy after the solder is melted (refer to Patent Literature 5), and the like have been reported as a method of reducing the joining temperature.

CITATION LIST

Patent Literature

Patent Literature 1: Japanese Patent No. 4928639
Patent Literature 2: Japanese Patent No. 5006081
Patent Literature 3: Japanese Unexamined Patent Publication No. 2014-167145
Patent Literature 4: Japanese Patent No. 6060199
Patent Literature 5: Japanese Patent No. 3736797

Non Patent Literature

Non Patent Literature 1: R. Khazaka, L. Mendizabal, D. Henry: J. ElecTron. Mater, 43(7), 2014, 2459-2466

SUMMARY OF INVENTION

Technical Problem

However, in the method of Patent Literature 4, in a case where the melting point of the solder is close to a use temperature of the device, the solder is softened at the use temperature, and thus, the connection reliability decreases. In addition, in a case where a heating step in which heating is performed at a temperature higher than or equal to the melting point of the solder is provided after a joining step, the solder is melted again due to the heating, and thus, causes a defect. In addition, in the method of Patent Literature 5, an intermetallic compound that is generated during the joints is brittle, and thus, a sufficient joining strength is not obtained, cycle reliability is degraded, and a thermal conductivity is low.

The present invention has been made in consideration of the circumstances described above, and an object thereof is to provide a metal paste for joints in which it is possible to perform the joints at a low-temperature of lower than or equal to 250° C., and to obtain an assembly having a sufficient joining strength, an assembly including a sintered body of the metal paste for joints and a production method for an assembly, and a semiconductor device including a sintered body of the metal paste for joints and a production method for a semiconductor device.

Solution to Problem

The present inventors have focused on and studied sintered copper die bonding material using a sintering phenomenon of copper particles, that is known in the related art. The sintered copper die bonding material of the related art is excellent in thermal conductivity and cycle fatigue resistance, and is inexpensive, but a high temperature of higher than or equal to 280° C. is necessary for joining the sintered copper die bonding material, and in a case where the sintered copper die bonding material of the related art is used, it is difficult to set a joining temperature (a sintering temperature) to be lower than or equal to 250° C. However, as a result of intensive studies of the present inventors, the present inventors have found that it is possible to perform the joints at a low temperature by using copper particles having a specific volume average particle diameter and specific alcohol in a metal paste for joints containing copper particles, and to obtain an assembly having a sufficient joining strength, and thus, have completed the present invention.

That is, a metal paste for joints according to one aspect of the present invention contains: metal particles; and linear or branched monovalent aliphatic alcohol having 1 to 20 carbon atoms. In the metal paste for joints, the metal particles include sub-micro copper particles having a volume average particle diameter of 0.12 μm to 0.8 μm. According to the metal paste for joints, it is possible to perform the joints at a low temperature of lower than or equal to 250° C., and to obtain an assembly having a sufficient joining strength. In addition, according to the metal paste for joints, it is possible to perform the joints without a pressure (pressureless joints), and to obtain an assembly having a sufficient joining strength even in the pressureless joints.

In one mode, a content of the monovalent aliphatic alcohol may be 0.3 part by mass to 1.8 parts by mass with respect to 100 parts by mass of the metal particles. In this mode, it is possible to further reduce a joining temperature, to obtain a more sufficient joining strength, and to prevent a temporal increase in the viscosity of the metal paste for joints due to the aggregation of the metal particles, and the separation and the precipitation of the metal particles.

In one mode, the metal particles further include flake-shaped micro copper particles having a maximum diameter of 2 μm to 50 μm and an aspect ratio of greater than or equal to 3.0. In this mode, a content of the sub-micro copper particles is 30 mass % to 90 mass % on the basis of a total mass of the metal particles, and a content of the micro copper particles is 10 mass % to 70 mass % on the basis of the total mass of the metal particles. In this mode, it is possible to sufficiently reduce volume contraction at the time of sintering the metal paste for joints, it is easy to ensure a joining strength of an assembly that is produced by sintering the metal paste for joints, and in a case where the metal paste for joints is used for joining the semiconductor element, a semiconductor device tends to exhibit a more excellent die shear strength and more excellent connection reliability.

In one mode, the metal particles further include at least one type of metal particles selected from the group consisting of zinc and silver, at a content of 0.01 mass % to 10 mass % on the basis of the total mass of the metal particles. In this mode, in a case where an adherend is gold or silver, a joining force is improved.

In one mode, the metal paste for joints contains a solvent component at a content of 2 mass % to 50 mass % on the basis of a total mass of the metal paste for joints. In this mode, it is possible to adjust the metal paste for joints to have a more suitable viscosity, and it is difficult to inhibit the sintering of the copper particles.

In one mode, the solvent component includes a solvent component having a boiling point of higher than or equal to 300° C. In this mode, a content of the solvent component having a boiling point of higher than or equal to 300° C. is 2 mass % to 50 mass % on the basis of the total mass of the metal paste for joints. In this mode, plasticity and adhesiveness are applied to the metal paste for joints until immediately before the start of the sintering, and it is easy to perform the joints without a pressure.

In one mode, the solvent component having a boiling point of higher than or equal to 300° C. includes at least one type selected from the group consisting of isobornyl cyclohexanol, tributyrin, butyl stearate, and octyl octanoate. In this mode, it is easier to perform the joints without a pressure.

In one mode, the metal paste for joints further contains a carboxylic acid having carbon atoms of greater than or equal to 10. In this mode, a content of the carboxylic acid is 0.07 part by mass to 2.10 parts by mass with respect to 100 parts by mass of the metal particles. In this mode, the effect of the present invention is remarkable.

A production method for an assembly according to one aspect of the present invention includes: a step of preparing a laminated body in which a first member, the metal paste for joints described above, and a second member are laminated in this order, and of sintering the metal paste for joints at a temperature of lower than or equal to 250° C. in a state of receiving self-weight of the first member or in a state of receiving the self-weight of the first member and a pressure of less than or equal to 0.01 MPa. According to the production method, it is possible to obtain the assembly having a sufficient joining strength by using the metal paste for joints described above. In addition, it is possible to reduce a residual thermal stress between members, and thus, it is possible to prevent a damage such as a crack from occurring on the member, and to obtain an effect of improving a yield ratio according to a reduction in thermal strain. In addition, it is possible to reduce the energy of the joining step.

A production method for a semiconductor device according to one aspect of the present invention includes: a step of preparing a laminated body in which a first member, the metal paste for joints described above, and a second member are laminated in this order, and of sintering the metal paste for joints at a temperature of lower than or equal to 250° C. in a state of receiving self-weight of the first member or in a state of receiving the self-weight of the first member and a pressure of less than or equal to 0.01 MPa. In this method, at least one of the first member and the second member is a semiconductor element. According to the production method, it is possible to obtain a semiconductor device having a sufficient joining strength by using the metal paste for joints described above. In addition, it is possible to reduce the residual thermal stress between the members, and thus, it is possible to prevent a characteristic change due to thermal strain with respect to a semiconductor, a damage such as a crack with respect to the member from occurring, and to obtain an effect of improving a yield ratio according to a reduction in the thermal strain. In addition, it is possible to reduce the energy of the joining step, and the semiconductor device produced by the production method can be excellent in the connection reliability.

An assembly according to one aspect of the present invention includes: a first member; a second member; and a sintered body of the metal paste for joints described above, the sintered body joining the first member and the second member together. In the assembly, the first member and the second member are joined together through the sintered body of the metal paste for joints having a sufficient joining force. In addition, the assembly includes the sintered body of the metal paste for joints containing copper that is excellent in the thermal conductivity, and thus, can be excellent in heat dissipating properties of the member.

In one mode, at least one of the first member and the second member contains at least one type of metal selected from the group consisting of copper, nickel, silver, gold, and palladium, on a surface in contact with the sintered body. In this mode, it is possible to further increase adhesion properties between at least one of the first member and the second member, and the sintered body.

A semiconductor device according to one aspect of the present invention, includes: a first member; a second member; and a sintered body of the metal paste for joints described above, the sintered body joining the first member and the second member together. In the semiconductor device, at least one of the first member and the second member is a semiconductor element. The semiconductor device has the sintered body of the metal paste for joints that has a sufficient joining force and contains copper having a high thermal conductivity and a high melting point, and thus, has has a sufficient die shear strength, is excellent in the connection reliability, and can also be excellent in power cycle resistance.

Advantageous Effects of Invention

According to the present invention, it is possible to provide a metal paste for joints in which it is possible to perform the joints at a low temperature of lower than or equal to 250° C., and to obtain an assembly having a sufficient joining strength, an assembly including a sintered body of the metal paste for joints and a production method for an assembly, and a semiconductor device including a sintered body of the metal paste for joints and a production method for a semiconductor device.

DESCRIPTION OF EMBODIMENTS

Figure 1:
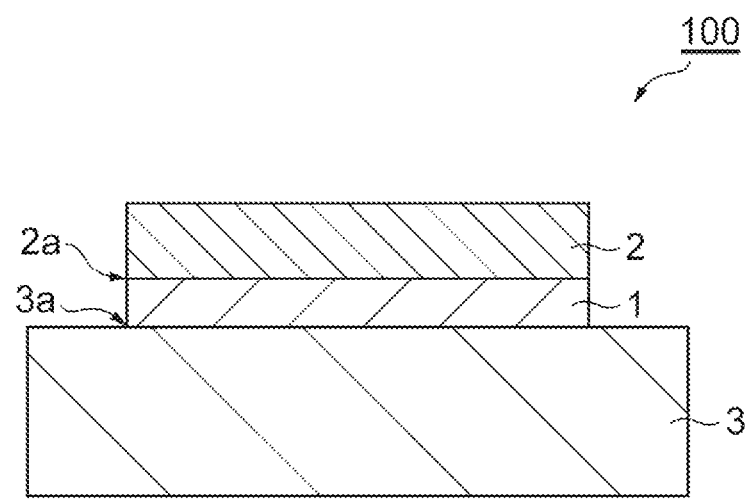
FIG. 1 is a schematic sectional view illustrating an example of an assembly that is produced by using a metal paste for joints of this embodiment.

Herein, only one type of exemplified materials or two or more types thereof can be combined, unless otherwise noted. In a case where there are a plurality of substances respectively corresponding to components in a metal paste for joints, unless otherwise noted, the content of each of the components in the metal paste for joints indicates the total amount of the plurality of substances in the metal paste for joints. A numerical range represented by using "to" indicates a range including the numerical values before and after "to" as the minimum value and the maximum value, respectively. Herein, in a numerical range that is gradually described, an upper limit value or a lower limit value of a numerical range in one step may be substituted with an upper limit value or a lower limit value of a numerical range in the other step. In addition, the upper limit value and the lower limit value described herein can be arbitrarily combined. In addition, in the numerical range described herein, the upper limit value or the lower limit value of the numerical range may be substituted with a value described in an example. The term of "layer" includes not only a structure having a shaped in which the layer is formed on the entire surface, but also a structure having a shape in which the layer is formed on a part of the surface, when observed as a plan view.

Hereinafter, embodiments of the present invention will be described in detail. However, the present invention is not limited to the following embodiments.

<Metal Paste for Joints>

A metal paste for joints according to this embodiment, for example, is used for joining a plurality of members. The metal paste for joints contains at least metal particles, and linear or branched monovalent aliphatic alcohol having 1 to 20 carbon atoms (hereinafter, will be referred to as "monovalent aliphatic alcohol" in accordance with a case). In such a metal paste for joints, the metal particles include at least sub-micro copper particles having a volume average particle diameter of 0.12 μm to 0.8 μm.

In the case of using the metal paste for joints according to this embodiment, it is possible to perform the joints at a low temperature of lower than or equal to 250° C., and to obtain an assembly having a sufficient joining strength. In addition, according to the metal paste for joints according to this embodiment, it is possible to obtain a sufficient joining strength without a pressure. As described above, in the case of using the metal paste for joints according to this embodiment, for example, it is possible to further increase production stability in the case of producing an assembly such as a semiconductor device, since it is not necessary to perform a thermal compression bonding process accompanying pressurization, it is possible to reduce a thermal stress between members having different thermal expansion differences, such as a chip and a substrate, and it is possible to reduce the strain of the assembly due to heat. In addition, the metal paste for joints is capable of improving the reliability of the device, and is capable of being applied even in the case of containing a material that is weak against heat, such as a glass epoxy substrate.

The effects as described above can be remarkable in a case where the metal particles are treated with a surface treatment agent. The reason is not apparent, but the present inventors have assumed as follows. That is, in a case where the metal particles are treated with the surface treatment agent, it is assumed that the monovalent aliphatic alcohol exerts a mutual interaction with the surface treatment agent, such as hydrogen bonding, and the surface treatment agent is easily desorbed from the copper particles. As a result thereof, it is assumed that a sintered body can be obtained at a lower heating treatment temperature, compared to a case where the monovalent aliphatic alcohol is not added, and thus, the effects described above are obtained. In particular, it is assumed that the number of carbon atoms of the monovalent aliphatic alcohol that is used in this embodiment is 1 to 20, and the monovalent aliphatic alcohol is linear or branched monovalent aliphatic alcohol, and thus, monovalent aliphatic alcohol is not bulky, and easily enters into the surface treatment agent that is densely adsorbed on a metal surface.

In addition, the metal paste for joints according to this embodiment contributes to low energy of a joining step. In addition, the copper particles are inexpensive, compared to silver particles, and thus, the metal paste for joints according to this embodiment can also be advantageous in the cost.

(Monovalent Aliphatic Alcohol)

The number of carbon atoms of the monovalent aliphatic alcohol is 1 to 20, and the monovalent aliphatic alcohol is linear or branched monovalent aliphatic alcohol. It is preferable that the number of carbon atoms of the monovalent aliphatic alcohol is less than or equal to 18, from the viewpoint of being more excellent in an effect of reducing a joining temperature. In addition, the number of carbon atoms of the monovalent aliphatic alcohol is preferably greater than or equal to 2, and is more preferably greater than or equal to 4, from the viewpoint of being hardly volatilized and lost in a drying process and a temperature rising process, and of obtaining stable performance. However, in a case where the number of carbon atoms is greater than or equal to 9, it is preferable that branched monovalent aliphatic alcohol is small, and it is more preferable that the monovalent aliphatic alcohol is linear monovalent aliphatic alcohol. From the above viewpoint, the number of carbon atoms of the monovalent aliphatic alcohol may be 2 to 20, may be 4 to 20, may be 9 to 20, or may be 9 to 18.

The monovalent aliphatic alcohol may be any one of primary alcohol, secondary alcohol, and tertiary alcohol. In a case where the number of carbon atoms is greater than or equal to 9, the primary alcohol or the secondary alcohol is preferable, and the primary alcohol is more preferable. In addition, the monovalent aliphatic alcohol may be a liquid, or may be a solid, at 1 atm and 25° C. However, it is preferable that a boiling point of the monovalent aliphatic alcohol is lower than or equal to 300° C. at 1 atm, from the viewpoint of being easily volatilized at the time of performing the sintering.

The monovalent aliphatic alcohol may be monovalent saturated aliphatic alcohol or monovalent unsaturated aliphatic alcohol.

Examples of the monovalent saturated aliphatic alcohol include methanol ($CH_4O$), ethanol ($C_2H_6O$), 1-propanol ($C_3H_8O$), 2-propanol ($C_3H_8O$), 1-butanol ($C_4H_{10}O$), 2-butanol ($C_4H_{10}O$), 2-methyl-1-propanol ($C_4H_{10}O$), 2-methyl-2-propanol ($C_4H_{10}O$), pentanol ($C_5H_{12}O$), hexanol ($C_6H_{14}O$), heptanol ($C_7H_{16}O$), octanol ($C_8H_{18}O$), nonanol ($C_9H_{20}O$), decanol ($C_{10}H_{22}O$), undecanol ($C_{11}H_{24}O$), dodecanol ($C_{12}H_{26}O$), tridecanol ($C_{13}H_{28}O$), tetradecanol ($C_{14}H_{30}O$) (for example, 1-tetradecanol (myristyl alcohol)), pentadecanol ($C_{15}H_{32}O$), 1-hexadecanol (cetyl alcohol) ($C_{16}H_{34}O$), 2-hexyl decanol ($C_{16}H_{34}O$), isooctadecanol ($C_{18}H_{38}O$) (for example, 16-methyl-1-heptadecanol (isostearyl alcohol)), and isoeicosanol ($C_{20}H_{42}O$). Examples of the monovalent unsaturated aliphatic alcohol include (Z)-9-octadecenol (oleyl alcohol) ($C_{18}H_{36}O$). Such monovalent aliphatic alcohol may have a substituent such as halogen.

The monovalent aliphatic alcohol is available as a commercially available product. Examples of such a commercially available product include "FINEOXOCOL 180T", "FINEOXOCOL 180", "FINEOXOCOL 1600", and "FINEOXOCOL 2000" (all are product names) manufactured by Nissan Chemical Corporation, "KALCOL 2098" and "KALCOL 4098" (all are product names) manufactured by Kao Corporation, and the like.

A part of the monovalent aliphatic alcohol may be adsorbed on the metal particle surface by hydrogen bonding or the like. In addition, a part of the monovalent aliphatic alcohol may exist as alkoxide. Furthermore, in this embodiment, the monovalent aliphatic alcohol is capable of functioning as a dispersion medium.

The content of the monovalent aliphatic alcohol may be greater than or equal to 0.3 part by mass, may be greater than or equal to 0.6 part by mass, or may be greater than or equal to 1 part by mass, with respect to 100 parts by mass of the metal particles. In a case where the content of the monovalent aliphatic alcohol is greater than or equal to 0.3 part by mass, it is possible to further reduce the joining temperature, and for example, a die shear strength of greater than or equal to 30 MPa tends to be obtained even in a case where a temperature at the time of performing the joints (the highest achieving temperature) is 225° C. In addition, the content of the monovalent aliphatic alcohol may be less than or equal to 1.8 parts by mass, may be less than or equal to 1.5 parts by mass, or may be less than or equal to 1.2 parts by mass, with respect to 100 parts by mass of the metal particles. In a case where the content of the monovalent aliphatic alcohol is less than or equal to 1.8 parts by mass, it is possible to prevent a temporal increase in the viscosity of the metal paste for joints due to the aggregation of the metal particles, and the separation and the precipitation of the metal particles, and it is possible to obtain a more sufficient joining strength. From such a viewpoint, the content of the monovalent aliphatic alcohol may be 0.3 part by mass to 1.8 parts by mass, may be 0.6 part by mass to 1.5 parts by mass, or may be 1 part by mass to 1.2 parts by mass, with respect to 100 parts by mass of the metal particles. Furthermore, the content of the surface treatment agent that is adsorbed on the surface of the metal particles is not included in 100 parts by mass of the metal particles described above.

(Metal Particles)

The metal particles according to this embodiment include at least the sub-micro copper particles. The metal particles may include copper particles other than the sub-micro copper particles, metal particles other than the copper particles, and the like. Examples of the copper particles other than the sub-micro copper particles include micro copper particles. Furthermore, herein, the sub-micro copper particles indicate copper particles having a particle diameter of greater than or equal to 0.1 μm and less than 1 and the micro copper particles indicate copper particles having a particle diameter of greater than or equal to 1 μm and less than 50 μm. Herein, for convenience, there is a case where the collection of a plurality of metal particles is referred to as the "metal particles". The same applies to the sub-micro copper particles, the micro copper particles, and the other metal particles.

[Sub-Micro Copper Particles]

The sub-micro copper particles may contain a metal that is inevitably contained, other than copper, but are particles substantially containing only copper. Examples of the sub-micro copper particles include sub-micro copper particles including copper particles having a particle diameter of 0.12 μm to 0.8 μm.

The sub-micro copper particles are capable of including the copper particles having a particle diameter of 0.12 μm to 0.8 μm, at a content of greater than or equal to 10 mass %. The sub-micro copper particles are capable of including the copper particles having a particle diameter of 0.12 μm to 0.8 μm, at a content of greater than or equal to 20 mass %, at a content of greater than or equal to 30 mass %, and at a content of 100 mass %, from the viewpoint of sintering properties of the metal paste for joints. In a case where a content ratio of the copper particles having a particle diameter of 0.12 μm to 0.8 μm to the sub-micro copper particles is greater than or equal to 20 mass %, it is possible to further increase the dispersibility of the copper particles, and to further suppress an increase in a viscosity and a decrease in a paste concentration.

The particle diameter of the copper particles can be obtained by the following method. The particle diameter of the copper particles, for example, can be calculated from an SEM image. A powder of the copper particles is put on a carbon tape for SEM with a spatula to be a sample for SEM. The sample for SEM is observed with an SEM device at a magnification of 5000 times. A quadrangle of the SEM image that is circumscribed on the copper particles is constructed by image processing software, and one side thereof is set to a particle diameter of the particles.

A volume average particle diameter of the sub-micro copper particles may be greater than or equal to 0.12 μm, or may be less than or equal to 0.8 μm. That is, the volume average particle diameter of the sub-micro copper particles may be 0.12 μm to 0.8 μm. In a case where the volume average particle diameter of the sub-micro copper particles is greater than or equal to 0.12 μm, an effect of suppressing a synthesis cost of the sub-micro copper particles, excellent dispersibility, and an effect of suppressing a used amount of the surface treatment agent are easily obtained. In a case where the volume average particle diameter of the sub-micro copper particles is less than or equal to 0.8 μm, an effect of being excellent in the sintering properties of the sub-micro copper particles is easily obtained. From the viewpoint of further obtaining the effects described above, the volume average particle diameter of the sub-micro copper particles may be greater than or equal to 0.15 μm, may be greater than or equal to 0.2 μm, or may be greater than or equal to 0.3 μm, and may be less than or equal to 0.6 μm, may be less than or equal to 0.5 μm, or may be less than or equal to 0.45 μm. For example, the volume average particle diameter of the sub-micro copper particles may be 0.15 μm to 0.8 μm, may be 0.15 μm to 0.6 μm, may be 0.2 μm to 0.5 μm, or may be 0.3 μm to 0.45 μm.

Furthermore, herein, the volume average particle diameter indicates a 50% volume average particle diameter. In a case where the volume average particle diameter of the copper particles is obtained, the volume average particle diameter can be obtained by a method of dispersing dry copper particles in which a volatile component is removed from the copper particles or the metal paste for joints that are a raw material, in a dispersion medium by using a dispersion agent, and of performing measurement with a particle size distribution measurement device of a light scattering method (for example, a Shimadzu nanoparticle diameter distribution measurement device (SALD-7500nano, manufactured by Shimadzu Corporation), and the like. In the case of using the particle size distribution measurement device of the light scattering method, hexane, toluene, α-terpineol, and the like can be used as the dispersion medium.

The content of the sub-micro copper particles may be greater than or equal to 30 mass %, may be greater than or equal to 35 mass %, may be greater than or equal to 40 mass %, or may be 45 mass %, and may be less than or equal to 90 mass %, may be less than or equal to 85 mass %, or may be less than or equal to 80 mass %, on the basis of the total mass of the metal particles. For example, the content of the sub-micro copper particles may be 30 mass % to 90 mass %, may be 35 mass % to 90 mass %, may be 40 mass % to 85 mass %, or may be 45 mass % to 80 mass %, on the basis of the total mass of the metal particles. In a case where the content of the sub-micro copper particles is within the range described above, it is easy to ensure a joining strength of an assembly that is produced by sintering the metal paste for joints, and in a case where the metal paste for joints is used for joining a semiconductor element, the semiconductor device tends to exhibit an excellent die shear strength and excellent connection reliability. Furthermore, the content of the surface treatment agent is not included in the content described above. In addition, the mass of the surface treatment agent that is adsorbed on the surface of the metal particles is not included in the total mass of the metal particles.

In a case where the metal particles include the micro copper particles, it is preferable that a lower limit value of the content of the sub-micro copper particles is 30 mass %, on the basis of the sum of the mass of the sub-micro copper particles and the mass of the micro copper particles, and it is preferable that an upper limit value of the content of the sub-micro copper particles is 90 mass %, on the basis of the sum of the mass of the sub-micro copper particles and the mass of the micro copper particles. That is, it is preferable that the content of the sub-micro copper particles is 30 mass % to 90 mass %, on the basis of the sum of the mass of the sub-micro copper particles and the mass of the micro copper particles. In a case where the content of the sub-micro copper particles is greater than or equal to 30 mass %, it is possible to fill a space between the micro copper particles, and it is easy to ensure the joining strength of the assembly that is produced by sintering the metal paste for joints, and in a case where the metal paste for joints is used for joining the semiconductor element, the semiconductor device tends to exhibit an excellent die shear strength and excellent connection reliability. In a case where the content of the sub-micro copper particles is less than or equal to 90 mass %, it is possible to sufficiently suppress volume contraction at the time of sintering the metal paste for joints, and thus, it is easy to ensure the joining strength of the assembly that is produced by sintering the metal paste for joints, and in a case where the metal paste for joints is used for joining the semiconductor element, the semiconductor device tends to exhibit an excellent die shear strength and excellent connection reliability. From the viewpoint of further obtaining the effects described above, the content of the sub-micro copper particles may be greater than or equal to 35 mass %, may be greater than or equal to 40 mass %, or may be greater than or equal to 45 mass %, and may be less than or equal to 85 mass %, or may be less than or equal to 80 mass %, on the basis of the sum of the mass of the sub-micro copper particles and the mass of the micro copper particles. For example, the content of the sub-micro copper particles may be 35 mass % to 85 mass %, may be 40 mass % to 85 mass %, or may be 45 mass % to 80 mass %, on the basis of the sum of the mass of the sub-micro copper particles and the mass of the micro copper particles. Furthermore, the content of the surface treatment agent is not included in the content described above. In addition, the mass of the surface treatment agent that is adsorbed on the surface of the metal particles is not included in the total mass of the metal particles.

The shape of the sub-micro copper particles is not particularly limited. Examples of the shape of the sub-micro copper particles include a spherical shape, a massive shape, a needle shape, a flake shape, an approximately spherical shape, and an aggregate thereof. The shape of the sub-micro copper particles may be a spherical shape, an approximately spherical shape, or a flake shape from the viewpoint of dispersibility and filling properties, and may be a spherical shape or an approximately spherical shape from the viewpoint of combustion properties, dispersibility, mixing properties with respect to flake-shaped micro particles (for example, flake-shaped micro copper particles), and the like. Herein, the "flake shape" includes flat plate shape such as a plate shape and a scale shape.

An aspect ratio of the sub-micro copper particles may be less than or equal to 5.0, or may be less than or equal to 3.0, from the viewpoint of the dispersibility, the filling properties, and the mixing properties with respect to the flake-shaped micro particles (for example, the flake-shaped micro copper particles). A lower limit of the aspect ratio of the sub-micro copper particles is not particularly limited. The aspect ratio of the sub-micro copper particles, for example, may be greater than or equal to 1.0. Herein, the "aspect ratio" indicates Long Side/Thickness of the particles. The long side and the thickness of the particles can be measured, for example, from an SEM image of the particles.

The sub-micro copper particles may be treated with a specific surface treatment agent. As described above, in a case where the sub-micro copper particles are treated with the surface treatment agent, the effects of the present invention can be remarkable. The surface treatment agent, for example, may be adsorbed on the surface of the sub-micro copper particles by the hydrogen bonding or the like, or may react with the sub-micro copper particles to be bonded to the surface of the sub-micro copper particles. That is, the sub-micro copper particles may have a compound derived from a specific surface treatment agent.

Examples of the specific surface treatment agent include an organic acid having carbon atoms of greater than or equal to 8. It is preferable that the organic acid having carbon atoms of greater than or equal to 8 is an organic acid having 8 to 16 carbon atoms. Examples of such an organic acid include an saturated aliphatic acid such as a caprylic acid, methyl heptanoate, ethyl hexanoate, propyl pentanoate, a pelargonic acid, methyl octanoate, ethyl heptanoate, propyl hexanoate, a capric acid, methyl nonanoate, ethyl octanoate, propyl heptanoate, butyl hexanoate, an undecanoic acid, methyl decanoate, ethyl nonanoate, propyl octanoate, butyl heptanoate, a lauric acid, methyl undecanoate, ethyl decanoate, propyl nonanoate, butyl octanoate, pentyl heptanoate, a tridecanoic acid, methyl dodecanoate, ethyl undecanoate, propyl decanoate, butyl nonanoate, pentyl octanoate, a myristic acid, methyl tridecanoate, ethyl dodecanoate, propyl undecanoate, butyl decanoate, pentyl nonanoate, hexyl octanoate, a pentadecanoic acid, methyl tetradecanoate, ethyl tridecanoate, propyl dodecanoate, butyl undecanoate, pentyl decanoate, hexyl nonanoate, a palmitic acid, methyl pentadecanoate, ethyl tetradecanoate, propyl tridecanoate, butyl dodecanoate, pentyl undecanoate, hexyl decanoate, heptyl nonanoate, methyl cyclohexane carboxylate, ethyl cyclohexane carboxylate, propyl cyclohexane carboxylate, butyl cyclohexane carboxylate, pentyl cyclohexane carboxylate, hexyl cyclohexane carboxylate, heptyl cyclohexane carboxylate, octyl cyclohexane carboxylate, and nonyl cyclohexane carboxylate; an unsaturated aliphatic acid such as an octenoic acid, a nonenoic acid, methyl nonenoate, a decenoic acid, an undecenoic acid, a dodecenoic acid, a tridecenoic acid, a tetradecenoic acid, a myristoleic acid, a pentadecenoic acid, a hexadecenoic acid, a palmitoleic acid, and a sapienic acid; and an aromatic carboxylic acid such as a terephthalic acid, a pyromellitic acid, o-phenoxy benzoate, methyl benzoate, ethyl benzoate, propyl benzoate, butyl benzoate, pentyl benzoate, hexyl benzoate, heptyl benzoate, octyl benzoate, and nonyl benzoate. Only one type of the organic acids may be used, or two or more types thereof may be used by being combined. Such an organic acid and the sub-micro copper particles described above are combined, and thus, the dispersibility of the sub-micro copper particles and desorbing properties of the organic acid at the time of performing the sintering tend to be compatible. In addition, in this embodiment, the desorbing properties of the organic acid at the time of performing the sintering as described above tend to be improved. For this reason, in the case of using the organic acid described above, the effects of the present invention can be remarkable. It is assumed that such effects are obtained in accordance with a mutual interaction between the monovalent aliphatic alcohol and the organic acid. In the case of using the organic acid having affinity with the monovalent aliphatic alcohol in the surface treatment agent described above, the effects of the present invention are more remarkable. Examples of such a surface treatment agent include a carboxylic acid having carbon atoms of greater than or equal to 10 (for example, long-chain alkyl carboxylate having an alkyl group having carbon atoms of greater than or equal to 9).

A treatment amount of the surface treatment agent may be greater than or equal to 0.07 mass %, may be greater than or equal to 0.10 mass %, may be greater than or equal to 0.20 mass %, may be greater than or equal to 0.50 mass %, or may be greater than or equal to 0.80 mass %, and may be less than or equal to 2.10 mass %, may be less than or equal to 1.60 mass %, or may be less than or equal to 1.10 mass %, on the basis of the total mass of the sub-micro copper particles after being subjected to a surface treatment. For example, the treatment amount of the surface treatment agent may be 0.07 to 2.10 mass %, 0.10 mass % to 1.60 mass %, may be 0.20 mass % to 1.10 mass %, may be 0.50 mass % to 1.10 mass %, or may be 0.80 mass % to 1.10 mass %, on the basis of the total mass of the sub-micro copper particles after being subjected to the surface treatment.

The treatment amount of the surface treatment agent may be an amount to be attached to the surface of the sub-micro copper particles in an one-molecule layer to a three-molecule layer. The treatment amount is measured by the following method. In the atmosphere, W1 (g) of the sub-micro copper particles subjected to the surface treatment are weighed in an alumina crucible that is treated at 700° C. for 2 times (for example, Model Number: 1-7745-07, manufactured by AS ONE Corporation), and are burnt at 700° C. for 1 times, in the atmosphere. After that, in hydrogen, the sub-micro copper particles are treated at 300° C. for 1 hour, and a mass W2 (g) of the copper particles in the crucible is measured. Next, the treatment amount of the surface treatment agent is calculated on the basis of the following expression.

Treatment Amount (mass %) of Surface Treatment Agent=$(W1-W2)/W1 \times 100$

A specific surface area of the sub-micro copper particles may be 0.5 m$^2$/g to 10 m$^2$/g, may be 1.0 m$^2$/g to 8.0 m$^2$/g, or may be 1.2 m$^2$/g to 6.5 m$^2$/g, from the viewpoint of the sintering properties, packing between particles, and the like. The specific surface area of the sub-micro copper particles can be calculated by measuring the dry sub-micro copper particles with a BET specific surface area measurement method.

The sub-micro copper particles described above have excellent sintering properties. By using the sub-micro copper particles described above, it is possible to reduce problems occurring in a joining material mainly using the copper nanoparticles, such as an expensive synthesis cost, poor dispersibility, and a decrease in a volume contraction amount after being sintered.

A material containing commercially available sub-micro copper particles can be used as the sub-micro copper particles according to this embodiment. Examples of the material containing the commercially available sub-micro copper particles include CH-0200 (a volume average particle diameter of 0.36 μm, manufactured by Mitsui Mining & Smelting Co., Ltd.), HT-14 (a volume average particle diameter of 0.41 μm, manufactured by Mitsui Mining & Smelting Co., Ltd.), CT-500 (a volume average particle diameter of 0.72 μm, manufactured by Mitsui Mining & Smelting Co., Ltd.), and Tn-Cu100 (a volume average particle diameter of 0.12 μm, manufactured by TAIYO NIPPON SANSO CORPORATION).

[Micro Copper Particles]

The micro copper particles may contain a metal that is inevitably contained, other than copper, but are particles substantially containing only copper. Examples of the micro copper particles include micro copper particles including copper particles having a particle diameter of 2 μm to 50 μm.

The micro copper particles are capable of including copper particles having a particle diameter of 2 μm to 50 μm, at a content of greater than or equal to 50 mass %. The micro copper particles are capable of including the copper particles having a particle diameter of 2 μm to 50 μm, at a content of greater than or equal to 70 mass %, at a content of greater than or equal to 80 mass %, and at a content of 100 mass %, from the viewpoint of the orientation in the assembly, a stiffening effect, and filling properties of a joining paste.

The volume average particle diameter of the micro copper particles may be greater than or equal to 2 μm, and may be less than or equal to 50 μm. That is, the volume average particle diameter of the micro copper particles may be 2 μm to 50 μm. In a case where the volume average particle diameter of the micro copper particles is within the range described above, it is possible to sufficiently reduce the volume contraction at the time of sintering the metal paste for joints, it is easy to ensure the joining strength of the assembly that is produced by sintering the metal paste for joints, and in a case where the metal paste for joints is used for joining the semiconductor element, the semiconductor device tends to exhibit a more excellent die shear strength and more excellent connection reliability. From the viewpoint of further obtaining the effects described above, the volume average particle diameter of the micro copper particles may be greater than or equal to 3 μm, and may be less than or equal to 20 μm. For example, the volume average particle diameter of the micro copper particles may be 3 μm to 50 μm, or may be 3 μm to 20 μm.

The content of the micro copper particles may be greater than or equal to 10 mass %, may be greater than or equal to 15 mass %, or may be greater than or equal to 20 mass %, and may be less than or equal to 70 mass %, may be less than or equal to 50 mass %, may be less than or equal to 45 mass %, or may be less than or equal to 40 mass %, on the basis of the total mass of the metal particles. For example, the content of the micro copper particles may be 10 mass % to 70 mass %, may be 10 mass % to 50 mass %, may be 15 mass % to 45 mass %, or may be 20 mass % to 40 mass %, on the basis of the total mass of the metal particles. In a case where the content of the micro copper particles is within the range described above, it is easy to ensure the joining strength of the assembly that is produced by sintering the metal paste for joints, and in a case where the metal paste for joints is used for joining the semiconductor element, the semiconductor device tends to exhibit a more excellent die shear strength and more excellent connection reliability. Furthermore, the content of the surface treatment agent is not included in the content described above. In addition, the mass of the surface treatment agent that is adsorbed on the surface of the metal particles is not included in the total mass of the metal particles.

The sum of the content of the sub-micro copper particles and the content of the micro copper particles may be greater than or equal to 80 mass % (for example, 80 mass % to 100 mass %), on the basis of the total mass of the metal particles. In a case where the sum of the content of the sub-micro copper particles and the content of the micro copper particles is within the range described above, it is possible to sufficiently reduce the volume contraction at the time of sintering the metal paste for joints, and it is easy to ensure the joining strength of the assembly that is produced by sintering the metal paste for joints. in a case where the metal paste for joints is used for joining the semiconductor element, the semiconductor device tends to exhibit an excellent die shear strength and excellent connection reliability. From the viewpoint of further obtaining the effects described above, the sum of the content of the sub-micro copper particles and the content of the micro copper particles may be greater than or equal to 90 mass %, may be greater than or equal to 95 mass %, or may be greater than or equal to 100 mass %, on the basis of the total mass of the metal particles. Furthermore, the content of the surface treatment agent is not included in the content described above. In addition, the mass of the surface treatment agent that is adsorbed on the surface of the metal particles is not included in the total mass of the metal particles.

It is preferable that the shape of the micro copper particles is a flake shape having an aspect ratio of greater than or equal to 3.0. By using the flake-shaped micro copper particles, it is possible to orient the micro copper particles in the metal paste for joints to be approximately parallel to a joining surface. Accordingly, it is possible to suppress the volume contraction at the time of sintering the metal paste for joints, and it is easy to ensure the joining strength of the assembly that is produced by sintering the metal paste for joints. In a case where the metal paste for joints is used for joining the semiconductor element, the semiconductor device tends to exhibit an excellent die shear strength and excellent connection reliability. From the viewpoint of further obtaining the effects described above, the aspect ratio of the flake-shaped micro copper particles is preferably greater than or equal to 4.0, and is more preferably greater than or equal to 6.0. An upper limit of the aspect ratio of the flake-shaped micro copper particles is not particularly limited. The aspect ratio of the flake-shaped micro copper particles, for example, may be less than or equal to 50. In addition, a maximum diameter and an average maximum diameter of the flake-shaped micro copper particles may be greater than or equal to 2 μm, or may be 3 μm, and may be less than or equal to 20 μm. For example, the maximum diameter and the average maximum diameter of the flake-shaped micro copper particles may be 2 μm to 50 μm, may be 3 μm to 50 μm, or may be 3 μm to 20 μm. The maximum diameter and the average maximum diameter of the flake-shaped micro copper particles, for example, are obtained from an SEM image of the particles, and are obtained as a long diameter X of the flake-shaped micro copper particles, and an average value Xav of the long diameters. In a three-dimensional shape of the flake-shaped micro copper particles, in two parallel planes circumscribed on the flake-shaped micro copper particles, the long diameter X is a distance between two parallel planes that is selected such that the distance between two parallel planes is maximized.

The shape of the flake-shaped micro copper particles can be defined by parameters such as the long diameter (the maximum diameter) X, a medium diameter Y (a width), a short diameter (a thickness) T. The medium diameter Y is orthogonal to two parallel planes to which the long diameter X is applied, and in two parallel planes circumscribed on the flake-shaped micro copper particles, is a distance between two parallel planes that is selected such that the distance between two parallel planes is maximized. The short diameter T is orthogonal to two parallel planes to which the long diameter X is applied and two parallel planes to which the medium diameter Y is applied, and in two parallel planes circumscribed on the flake-shaped micro copper particles, is a distance between two parallel planes that is selected such that the distance between two parallel planes is maximized.

The average value Xav of the long diameter may be greater than or equal to 1 μm and less than or equal to 20.0 μm, may be greater than or equal to 1 μm and less than or equal to 10 μm, or may be greater than or equal to 3 μm and less than or equal to 10 μm. In a case where Xav is within the range described above, in the assembly that is produced by sintering the metal paste for joints (a copper paste for joints), it is easy to form a sintered body of the metal paste for joints with a suitable thickness.

Xav/Tav that is a ratio (an aspect ratio) of the average value Xav of the long diameter to the average value Tav of the short diameter may be greater than or equal to 4.0, may be greater than or equal to 6.0, or may be greater than or equal to 10.0. In a case where Xav/Tav is within the range described above, the flake-shaped micro copper particles in the metal paste for joints are easily oriented to be approximately parallel to the joining surface, and it is possible to suppress the volume contraction at the time of sintering the metal paste for joints, and it is easy to ensure the joining strength of the assembly that is produced by sintering the metal paste for joints. In a case where the metal paste for joints is used for joining the semiconductor element, the die shear strength and the connection reliability of the semiconductor device are easily improved.

Xav/Yav that is a ratio of the average value Xav of the long diameter to the average value Yav of the medium diameter may be less than or equal to 2.0, may be less than or equal to 1.7, or may be less than or equal to 1.5. In a case where Xav/Yav is within the range described above, flake-shaped particles are obtained in which the shape of the flake-shaped micro copper particles has a certain area, the flake-shaped micro copper particles in the metal paste for joints are easily oriented to be approximately parallel to the joining surface, it is possible to suppress the volume contraction at the time of sintering the metal paste for joints, and it is easy to ensure the joining strength of the assembly that is produced by sintering the metal paste for joints. In a case where the metal paste for joints is used for joining the semiconductor element, the die shear strength and the connection reliability of the semiconductor device are easily improved. A case where Xav/Yav is greater than 2.0 indicates that the shape of the flake-shaped micro copper particles is close to an elongated linear shape.

Yav/Tav that is a ratio of the average value Yav of the medium diameter to the average value Tav of the short diameter may be greater than or equal to 2.5, may be greater than or equal to 4.0, or may be greater than or equal to 8.0. In a case where Yav/Tav is within the range described above, the flake-shaped micro copper particles in the copper paste for joints are easily oriented to be approximately parallel to the joining surface, it is possible to suppress the volume contraction at the time of sintering the copper paste for joints, and it is easy to ensure the joining strength of the assembly that is produced by sintering the copper paste for joints. In a case where the copper paste for joints is used for joining the semiconductor element, the die shear strength and the connection reliability of the semiconductor device are easily improved.

A method of calculating the long diameter X and the medium diameter Y of the flake-shaped micro copper particles from an SEM image is exemplified. A powder of the flake-shaped micro copper particles is put on a carbon tape for SEM with a spatula to be a sample for SEM. The sample for SEM is observed with an SEM device at a magnification of 5000 times. A rectangle of the SEM image that is circumscribed on the flake-shaped micro copper particles is constructed by image processing software, a long side of the rectangle is set to the long diameter X of the particles, and a short side of the rectangle is set to the medium diameter Y of the particles. Such measurement is performed with respect to 50 or more flake-shaped micro copper particles by using a plurality of SEM images, and thus, the average value Xav of the long diameter and the average value Yav of the medium diameter are calculated.

In the micro copper particles, the presence or absence of the treatment with the surface treatment agent is not particularly limited. The micro copper particles may be treated with the surface treatment agent from the viewpoint of dispersion stability and oxidation resistance. In this embodiment, in a case where the micro copper particles are subjected to the surface treatment, the effects of the present invention can be remarkable. The surface treatment agent may be removed at the time of performing the joints. Examples of such a surface treatment agent include an aliphatic carboxylic acid such as a palmitic acid, a stearic acid, an arachidic acid, and an oleic acid; an aromatic carboxylic acid such as a terephthalic acid, a pyromellitic acid, and o-phenoxy benzoate; alkyl amine such as octyl amine, dodecyl amine, and stearyl amine; aliphatic nitrile such as stearonitrile and decane nitrile; a silane coupling agent such as alkyl alkoxy silane; a polymer treatment material such as polyethylene glycol, polyvinyl alcohol, polyvinyl pyrrolidone, and a silicone oligomer, and the like. Among them, the carboxylic acid having carbon atoms of greater than or equal to 10 is preferable. Only one type of the surface treatment agents may be used, or two or more types thereof may be used by being combined.

The treatment amount of the surface treatment agent may be an amount to be attached to the particle surface in an one or more-molecule layer. The treatment amount of the surface treatment agent is changed in accordance with a specific surface area of the micro copper particles, a molecular weight of the surface treatment agent, and a minimum cover area of the surface treatment agent. The treatment amount of the surface treatment agent may be greater than or equal to 0.001 mass %, on the basis of the total mass of the micro copper particles after being subjected to the surface treatment. The specific surface area of the micro copper particles, the molecular weight of the surface treatment agent, and the minimum cover area of the surface treatment agent can be calculated by the method described above.

In a case where the sub-micro copper particles and the micro copper particles are used together, it is difficult for the volume contraction and sintering contraction accompanied by drying to increase, and it is difficult to occur peeling from a covered surface at the time of sintering the metal paste for joints. That is, the sub-micro copper particles and the micro copper particles are used together, and thus, it is possible to suppress the volume contraction at the time of sintering the metal paste for joints, and it is possible for the assembly to have a more sufficient joining strength. In a case where the metal paste for joints using the sub-micro copper particles and the micro copper particles together is used for joining the semiconductor element, an effect is obtained in which the semiconductor device exhibits a more excellent die shear strength and more excellent connection reliability.

A material containing commercially available micro copper particles can be used as the micro copper particles according to this embodiment. Examples of the material containing commercially available micro copper particles include MA-CO25 (a volume average particle diameter of 7.5 μm and an average maximum diameter of 4.1 μm, manufactured by Mitsui Mining & Smelting Co., Ltd.), 3L3 (a volume average particle diameter of 8.0 μm and an average maximum diameter of 7.3 μm, manufactured by Fukuda Metal Foil & Powder Co., Ltd.), 2L3 (a volume average particle diameter of 9.9 μm and an average maximum diameter of 9 μm, manufactured by Fukuda Metal Foil & Powder Co., Ltd.), 2L3N/A (a volume average particle diameter of 9.4 μm and an average maximum diameter of 9 μm, manufactured by Fukuda Metal Foil & Powder Co., Ltd.), 1110F (a volume average particle diameter of 3.8 μm and an average maximum diameter of 5 μm, manufactured by Mitsui Mining & Smelting Co., Ltd.), and HWQ of 3.0 μm (a volume average particle diameter of 3.0 μm, manufactured by Fukuda Metal Foil & Powder Co., Ltd.).

[Metal Particles Other than Copper Particles]

Examples of metal particles other than the copper particles include at least one type of metal particles selected from the group consisting of zinc and silver. In a case where such metal particles are mixed, the joining force is improved in a case where an adherend is gold or silver. The other metal particles described above may be treated with the surface treatment agent. The content of the other metal particles described above is preferably 0.01 mass % to 10 mass %, is more preferably 0.05 mass % to 5 mass %, and is even more preferably 0.1 mass % to 2 mass %, on the basis of the total mass of the metal particles, from the viewpoint of an effect of further improving adhesion properties. A volume average particle diameter of the other metal particles described above may be 0.01 μm to 10 μm, may be 0.01 μm to 5 μm, or may be 0.05 μm to 3 μm. The shape of the other metal particles is not particularly limited. Furthermore, the content of the surface treatment agent is not included in the content described above. In addition, the mass of the surface treatment agent that is adsorbed on the surface of the metal particles is not included in the total mass of the metal particles.

(Components Other than Metal Particles and Monovalent Aliphatic Alcohol)

The metal paste for joints may further contain components other than the metal particles and the monovalent aliphatic alcohol. Examples of such components include the surface treatment agent of the metal particles described above, a solvent component (excluding the surface treatment agent described above), an additive, and the like.

[Surface Treatment Agent]

An example of the surface treatment agent that can be contained in the metal paste for joints is as described above, and examples of the surface treatment agent include the carboxylic acid having carbon atoms of greater than or equal to 10. The surface treatment agent may be adsorbed on the metal particles by hydrogen bonding or the like, or a part of the surface treatment agent may be liberated or dispersed in the paste (for example, in the solvent component). The content of the surface treatment agent may be greater than or equal to 0.07 part by mass, may be greater than or equal to 0.10 part by mass, or may be greater than or equal to 0.20 part by mass, and may be less than or equal to 2.10 parts by mass, may be less than or equal to 1.60 parts by mass, or may be less than or equal to 1.10 parts by mass, with respect to 100 parts by mass of the metal particles. For example, the content of the surface treatment agent may be 0.07 part by mass to 2.10 parts by mass, may be 0.10 part by mass to 1.60 parts by mass, or may be 0.20 part by mass to 1.10 parts by mass, with respect to 100 parts by mass of the metal particles. Furthermore, it is not necessary that the component described above as the surface treatment agent is contained for the purpose of the surface treatment of the metal particles, and the component may be contained in the metal paste for joints for the purpose other than the surface treatment (for example, as a dispersion medium).

[Solvent Component]

The solvent component functions as a dispersion medium. The solvent component is not particularly limited, and for example, may be a volatile solvent component. Examples of the volatile solvent component include alcohols such as monohydric alcohol other than the monovalent aliphatic alcohol described above and polyhydric alcohol, ethers, esters, acid amide, aliphatic hydrocarbon, aromatic hydrocarbon, and the like. Specifically, alcohols such as cyclohexanol, ethylene glycol, diethylene glycol, propylene glycol, butylene glycol, and α-terpineol; ethers such as diethylene glycol dimethyl ether, diethylene glycol diethyl ether, diethylene glycol dibutyl ether, diethylene glycol butyl methyl ether, diethylene glycol isopropyl methyl ether, triethylene glycol dimethyl ether, triethylene glycol butyl methyl ether, propylene glycol dimethyl ether, propylene glycol diethyl ether, propylene glycol dibutyl ether, propylene glycol dipropyl ether, and tripropylene glycol dimethyl ether; esters such as ethylene glycol ethyl ether acetate, ethylene glycol butyl ether acetate, diethylene glycol ethyl ether acetate, diethylene glycol butyl ether acetate, dipropylene glycol methyl ether acetate (DPMA), ethyl lactate, butyl lactate, γ-butyrolactone, and propylene carbonate; acid amide such as N-methyl-2-pyrrolidone, N,N-dimethyl acetamide, and N,N-dimethyl formamide; aliphatic hydrocarbon such as cyclohexane, octane, nonane, decane, and undecane; aromatic hydrocarbon such as benzene, toluene, and xylene, and the like.

The content of the solvent component may be greater than or equal to 2 mass %, or may be greater than or equal to 5 mass %, and may be less than or equal to 50 mass %, may be less than or equal to 30 mass %, or may be less than or equal to 20 mass %, on the basis of the total mass of the metal paste for joints. For example, the content of the solvent component may be 2 mass % to 50 mass %, may be 5 mass % to 30 mass %, or may be 5 mass % to 20 mass %, on the basis of the total mass of the metal paste for joints. In addition, the content of the solvent component may be 5 parts by mass to 50 parts by mass with respect to 100 parts by mass of the total mass of the metal particles. In a case where the content of the solvent component is within the range described above, it is possible to adjust the metal paste for joints to have a more suitable viscosity, and it is difficult to inhibit the sintering of the copper particles.

It is preferable that the solvent component includes a solvent component having a boiling point of higher than or equal to 300° C. By containing the solvent component having a boiling point of higher than or equal to 300° C., plasticity and adhesiveness are applied until immediately before the start of the sintering metal paste for joints, and it is easy to perform the joints without a pressure. The boiling point of the solvent component having a boiling point of higher than or equal to 300° C. may be 300° C. to 450° C., may be 305° C. to 400° C., or may be 310° C. to 380° C., from the viewpoint of rapidly evaporating and removing the solvent component at the time of reaching the joining temperature, without hindering the sintering and densification, when the metal paste for joints is sintered.

Examples of the solvent component having a boiling point of higher than or equal to 300° C. include isobornyl cyclohexanol (MTPH, manufactured by Nippon Terpene Chemicals, Inc.), butyl stearate, EXEPARL BS (manufactured by Kao Corporation), stearic acid stearyl, EXEPARL SS (manufactured by Kao Corporation), 2-ethyl hexyl stearate, EXEPARL EH-S (manufactured by Kao Corporation), isotridecyl stearate, EXEPARL TD-S (manufactured by Kao Corporation), heptadecane, octadecane, nonadecane, eicosane, heneicosa, docosane, methyl heptadecane, tridecyl cyclohexane, tetradecyl cyclohexane, pentadecyl cyclohexane, hexadecyl cyclohexane, undecyl benzene, dodecyl benzene, tetradecyl benzene, tridecyl benzene, pentadecyl benzene, hexadecyl benzene, heptadecyl benzene, nonyl naphthalene, diphenyl propane, octyl octanoate, methyl myristate, ethyl myristate, methyl linoleate, stearate methyl stearate, triethylene glycol bis(2-ethyl hexanoate), tributyl citrate, dibutyl sebacate, methoxy phenethyl alcohol, benzyl phenol ($C_{13}H_{12}O$), hexadecane nitrile, heptadecane nitrile, benzyl benzoate, cinmethylin, bis(2-ethyl hexyl) adipate, and the like. It is preferable that the solvent component having a boiling point of higher than or equal to 300° C. includes at least one type selected from the group consisting of isobornyl cyclohexanol, tributyrin, butyl stearate, and octyl octanoate, from the viewpoint of more easily performing the joints without a pressure.

The content of the solvent component having a boiling point of higher than or equal to 300° C. may be greater than or equal to 2 mass %, may be greater than or equal to 2.2 mass %, or may be greater than or equal to 2.4 mass %, and may be less than or equal to 50 mass %, may be less than or equal to 45 mass %, may be less than or equal to 40 mass %, may be less than or equal to 20 mass %, may be less than or equal to 10 mass %, or may be less than or equal to 5 mass %, on the basis of the total mass of the metal paste for joints. For example, the content of the solvent component may be 2 mass % to 50 mass %, on the basis of the total mass of the metal paste for joints.

[Additive]

Examples of the additive include a wetting improver such as a nonionic surfactant and a fluorine-based surfactant; an antifoaming agent such as silicone oil; an ion trapping agent such as an inorganic ion exchanger, and the like. The content of the additive can be suitably adjusted within a range not inhibiting the effects of the present invention.

The viscosity of the metal paste for joints described above is not particularly limited, and in the case of molding the metal paste for joints by a method such as printing and coating, the metal paste for joints may be adjusted to have a viscosity suitable for a molding method. A Casson viscosity of the metal paste for joints at 25° C. may be greater than or equal to 0.05 Pa·s, or may be greater than or equal to 0.06 Pa·s, and may be less than or equal to 2.0 Pa·s, or may be less than or equal to 1.0 Pa·s. For example, the Casson viscosity of the metal paste for joints at 25° C. may be 0.05 Pa·s to 2.0 Pa·s, or may be 0.06 Pa·s to 1.0 Pa·s.

It is preferable that the metal paste for joints according to this embodiment is stored at a temperature of lower than 30° C. In a case where the metal paste for joints according to this embodiment is stored at a temperature of higher than or equal to 30° C., the monovalent aliphatic alcohol, and the solvent component that is contained in accordance with a case are easily volatilized, and the concentration of the metal paste for joints may be changed. As a result thereof, in a case where the metal paste for joints is provided on a member, there is a case where it is difficult to provide the metal paste for joints in a desired portion. The metal paste for joints of this embodiment may be stored by being frozen (for example, −30° C.), or may be stored at a temperature lower than or equal to −30° C. However, it is preferable that the metal paste for joints according to this embodiment is used at a room temperature (for example, 10° C. to 30° C.), and thus, in a case where the metal paste for joints is stored at a temperature lower than −30° C., it takes time to unfreeze the metal paste for joints, and it is necessary to perform heating with respect to the metal paste for joints in order to unfreeze the metal paste for joints, and therefore, a process cost increases.

It is preferable that a change in the volume average particle diameter of the metal paste for joints before and after being stored is within 20%. In a case where the copper particles configuring the metal paste for joints (for example, the sub-micro copper particles) are aggregated in the metal paste for joints to be secondary particles, the volume average particle diameter increases. In a case where the volume average particle diameter increases, a void easily enters into the metal paste for joints after being sintered, and thus, there is a case where a thermal conductivity decreases. In addition, the void becomes a stress concentration point, and thus, a crack is easily generated, and it is difficult to obtain desired performance (for example, performance that is evaluated in a temperature cycle test and a power cycle test).

<Preparation of Metal Paste for Joints>

The metal paste for joints can be prepared by mixing the sub-micro copper particles and the monovalent aliphatic alcohol described above, the micro copper particles that is contained in accordance with a case, the other metal particles, the additive, and the solvent component. After the respective components are mixed, a stirring treatment may be performed. In the metal paste for joints, a maximum particle diameter of a dispersion liquid may be adjusted by a classification operation. At this time, the maximum particle diameter of the dispersion liquid can be less than or equal to 20 μm, or can be less than or equal to 10 μm. The metal particles such as the sub-micro copper particles described above may be used by being treated with the surface treatment agent.

In a case where the components other than the sub-micro copper particles and the monovalent aliphatic alcohol (for example, the micro copper particles, the other metal particles, the additive, and the solvent component) are added, the metal paste for joints may be prepared by mixing in advance the sub-micro copper particles, the monovalent aliphatic alcohol, and the solvent component, and then, by performing a dispersion treatment to prepare a dispersion liquid of the sub-micro copper particles, and by mixing the components other than the sub-micro copper particles and the monovalent aliphatic alcohol into the obtained dispersion liquid. According to such a procedure, for example, in a case where the micro copper particles are used, the dispersibility of the sub-micro copper particles is improved, mixing properties with respect to the micro copper particles become excellent, and the performance of the metal paste for joints is further improved. In addition, in the dispersion liquid of the sub-micro copper particles, an aggregate may be removed by the classification operation.

The stirring treatment can be performed by using a stirrer. Examples of the stirrer include a rotation and revolution type stirring device, a mortar machine, HIVIS DISPER MIX, a biaxial kneader, a triple roll mill, a planetary mixer, a thin layer shear disperser, and the like.

The classification operation, for example, can be performed by using filtration, spontaneous precipitation, centrifugal separation, and the like. Examples of a filter for filtration include a metal mesh, a metal filter, a nylon mesh, and the like.

Examples of the dispersion treatment include a thin layer shear disperser, a disperizer, a bead mill, HIVIS DISPER MIX, an ultrasonic homogenizer, a high shear mixer, a narrow gap triple roll mill, a wet type super-atomization device, a supersonic jet mill, an ultrahigh pressure homogenizer, and the like.

<Assembly and Semiconductor Device>

Hereinafter, the assembly and the semiconductor device according to this embodiment will be described in detail, with reference to the drawings. Furthermore, in the drawings, the same reference numerals will be applied to the same or the corresponding portions, and the repeated description will be omitted. In addition, a dimensional ratio of the drawings is not limited to the illustrated ratio.

FIG. 1 is a schematic sectional view illustrating an example of the assembly that is produced by using the metal paste for joints of this embodiment.

An assembly 100 illustrated in FIG. 1 includes a first member 2, a second member 3, a sintered body 1 of the metal paste for joints that joins the first member 2 and the second member 3 together.

Examples of the first member 2 and the second member 3 include a semiconductor element such as IGBT, a diode, a Schottky barrier diode, MOS-FET, a thyristor, logic, a sensor, an analog integrated circuit, an LED, a semiconductor laser, and a transmitter; a lead frame; a ceramic substrate with a metal plate (for example, DBC); a base material for mounting a semiconductor element, such as an LED package; metal wiring such as a copper ribbon and a metal frame; a block body such as a metal block; a power feeding member such as a terminal; a heatsink; a water cooling plate, and the like.

Surfaces 2a and 3a of the first member 2 and the second member 3 that are in contact with the sintered body of the metal paste for joints may contain a metal. Examples of the metal include copper, nickel, silver, gold, palladium, platinum, lead, tin, cobalt, and the like. Only one type of the metals may be used, or two or more types thereof may be used by being combined. In addition, the surface in contact with the sintered body may contain an alloy containing the metals described above. Examples of the metal to be used in the alloy include zinc, manganese, aluminum, beryllium, titanium, chromium, iron, molybdenum, and the like, in addition to the metals described above. Examples of a member containing a metal on a surface in contact with the sintered body include a member including various metal platings (a chip including metal plating, a lead frame including various metal platings, and the like), a wire, a heat spreader, a ceramic substrate with a metal plate, a lead frame including various metals, a copper plate, a copper foil, and the like.

A die shear strength of the assembly 100 may be greater than or equal to 15 MPa, may be greater than or equal to 20 MPa, may be greater than or equal to 25 MPa, or may be greater than or equal to 30 MPa, from the viewpoint of sufficiently joining the first member 2 and the second member 3 together. The die shear strength can be measured by using a universal bonding tester (Royce 650, manufactured by Royce Instruments), a versatile bonding tester (4000 Series, manufactured by Nordson DAGE), or the like.

A thermal conductivity of the sintered body 1 of the metal paste for joints may be greater than or equal to 100 W/(m·K), may be greater than or equal to 120 W/(m·K), or may be greater than or equal to 150 W/(m·K), from the viewpoint of heat dissipating properties and connection reliability at a high temperature. The thermal conductivity can be calculated from a thermal diffusivity, specific heat capacity, and a density of the sintered body of the metal paste for joints.

In the assembly 100 described above, in a case where the first member 2 is a semiconductor element, the assembly 100 becomes a semiconductor device. The semiconductor device to be obtained is capable of having a sufficient die shear strength and sufficient connection reliability.

Figure 2:
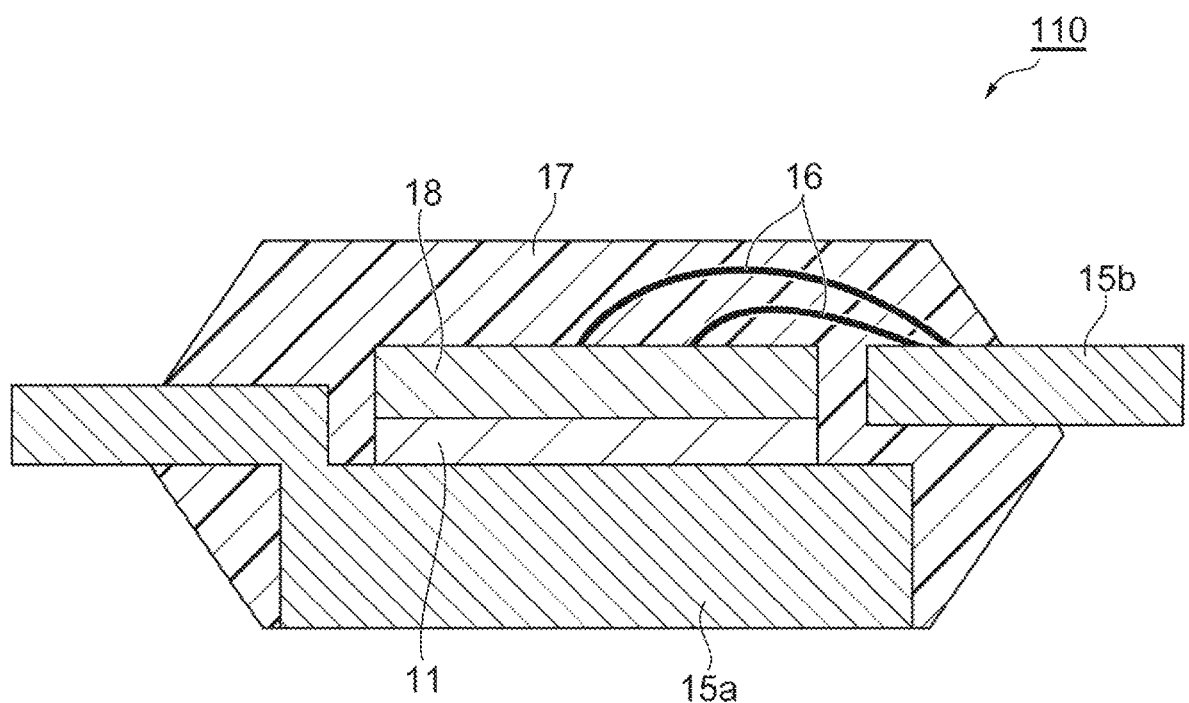
FIG. 2 is a schematic sectional view illustrating an example of a semiconductor device that is produced by using the metal paste for joints of this embodiment.

FIG. 2 is a schematic sectional view illustrating an example of the semiconductor device that is produced by using the metal paste for joints of this embodiment. A semiconductor device 110 illustrated in FIG. 2 includes a sintered body 11 of the metal paste for joints according to this embodiment, a lead frame 15a, a lead frame 15b, a wire 16, a semiconductor element 18 connected onto the lead frame 15a through the sintered body 11, and a mold resin 17 molding the constituents described above. The semiconductor element 18 is connected to the lead frame 15b through the wire 16.

Examples of the semiconductor device that is produced by using the metal paste for joints of this embodiment include a power module such as a diode, a rectifier, a thyristor, a MOS gate driver, a power switch, a power MOSFET, IGBT, a Schottky diode, and a fast recovery diode; a transmitter; an amplifier; a high-intensity LED module; a sensor, and the like.

<Production Method for Assembly and Semiconductor Device>

Hereinafter, a production method for the assembly and the semiconductor device using the metal paste for joints of this embodiment will be described.

Figure 3:
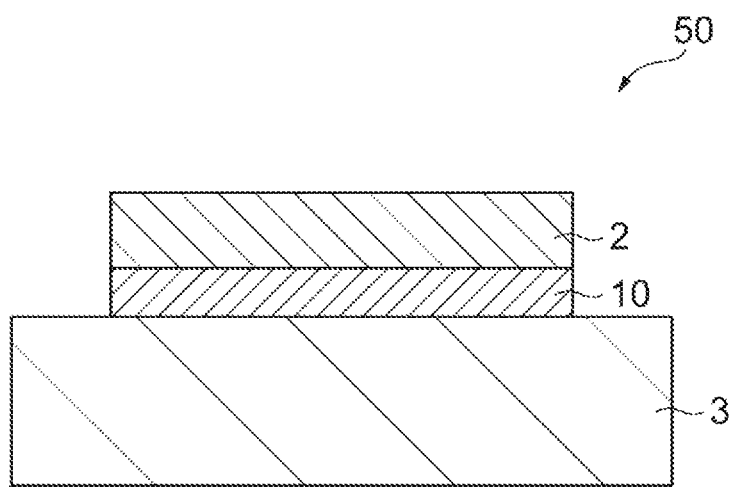
FIG. 3(a)-(b) is a schematic sectional view for illustrating a production method for the assembly illustrated in FIG. 1.
Figure 3:
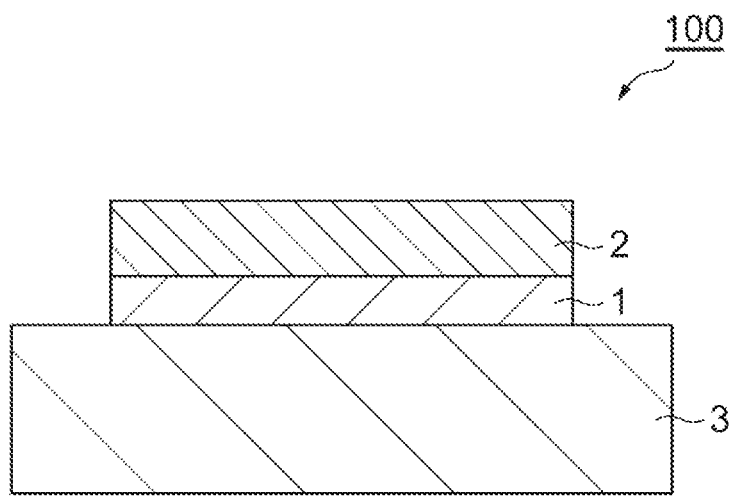

FIG. 3 (FIG. 3(a) and FIG. 3(b)) is a schematic sectional view for illustrating a production method for the assembly 100. The production method for the assembly 100 according to this embodiment includes a step of preparing a laminated body 50 in which the first member 2, a metal paste 10 for joints, and the second member 3 are laminated in this order in a direction side in which the self-weight of the first member 2 acts, (FIG. 3(a)), and of sintering the metal paste 10 for joints at a temperature of lower than or equal to 250° C., in a state of receiving the self-weight of the first member 2 or in a state of receiving the self-weight of the first member 2 and a pressure of less than or equal to 0.01 MPa. Accordingly, the assembly 100 is obtained (FIG. 3(b)). The direction in which the self-weight of the first member 2 acts can also be referred to as a direction in which a gravitational force acts.

The laminated body 50 described above, for example, can be prepared by providing the metal paste 10 for joints of this embodiment in a necessary portion of the first member 2 or the second member 3, and then, by arranging the member (the first member 2 or the second member 3) to be joined onto the metal paste 10 for joints.

A method of providing the metal paste 10 for joints of this embodiment in the necessary portion of the first member 2 and the second member 3 may be a method of depositing the metal paste for joints. Examples of such a method include a printing method such as screen printing, transfer printing, offset printing, anastatic printing, intaglio printing, gravure printing, stencil printing, and jet printing, a method using a dispenser (for example, a jet dispenser and a needle dispenser), a comma coater, a slit coater, a die coater, a gravure coater, slit coating, a bar coater, an applicator, a spray coater, a spin coater, a dip coater, and the like, a method of soft lithography, a particle deposition method, an electrodeposition coating method, and the like.

The thickness of the metal paste 10 for joints may be greater than or equal to 1 μm, may be greater than or equal to 5 μm, may be greater than or equal to 10 μm, may be greater than or equal to 15 μm, may be greater than or equal to 20 μm, or may be greater than or equal to 50 μm, and may be less than or equal to 3000 μm, may be less than or equal to 1000 μm, may be less than or equal to 500 μm, may be less than or equal to 300 μm, may be less than or equal to 250 μm, or may be less than or equal to 150 μm. For example, the thickness of the metal paste 10 for joints may be 1 μm to 1000 μm, may be 10 μm to 500 μm, may be 50 μm to 200 μm, may be 10 μm to 3000 μm, may be 15 μm to 500 μm, may be 20 μm to 300 μm, may be 5 μm to 500 μm, may be 10 μm to 250 μm, or may be 15 μm to 150 μm.

The metal paste 10 for joints that is provided on the member may be suitably dried from the viewpoint of preventing a flux and a void from being generated at the time of performing the sintering. A gas atmosphere at the time of performing drying may be the atmospheric air, may be an oxygen-free atmosphere of nitrogen, rare gas, or the like, or may be a reduction atmosphere of hydrogen, a formic acid, or the like. In a drying method, drying may be performed after being left to stand at normal temperature (for example, 10° C. to 30° C.), heating drying may be performed, or reduced-pressure drying may be performed. In the heating drying or the reduced-pressure drying, for example, a hot plate, a hot air dryer, a hot air heating furnace, a nitrogen dryer, an infrared ray dryer, an infrared ray heating furnace, a far-infrared ray heating furnace, a microwave heating device, a laser heating device, an electromagnetic heating device, a heater heating device, a vapor heating furnace, a hot plate pressing device, and the like can be used. A drying temperature and a drying time may be suitably adjusted in accordance with of the type and the amount of the volatile component that is used (for example, the monovalent aliphatic alcohol and the solvent component). A drying condition (the drying temperature and the drying time), for example, may be a condition of performing drying at 50° C. to 180° C. for 1 minute to 120 minutes.

Examples of a method of arranging one member on the other member (for example, a method of arranging the first member 2 on the second member 3 on which the metal paste 10 for joints is provided) include a method using a chip mounter, a flip chip button, a carbon or ceramic positioning jig, and the like.

The laminated body 50 is subjected to a heating treatment, and thus, the metal paste 10 for joints is sintered. Accordingly, the sintered body 1 is obtained. In the heating treatment, for example, a hot plate, a hot air dryer, a hot air heating furnace, a nitrogen dryer, an infrared ray dryer, an infrared ray heating furnace, a far-infrared ray heating furnace, a microwave heating device, a laser heating device, an electromagnetic heating device, a heater heating device, a vapor heating furnace, and the like can be used.

The gas atmosphere at the time of performing the sintering may be an oxygen-free atmosphere from the viewpoint of suppressing the oxidation of the sintered body and the member (the first member 2 and the second member 3). The gas atmosphere at the time of performing the sintering may be a reduction atmosphere from the viewpoint of removing a surface oxide of the copper particles in the metal paste for joints. Examples of the oxygen-free atmosphere include an oxygen-free gas atmosphere of nitrogen, rare gas, or the like, or vacuum. Examples of the reduction atmosphere include a pure hydrogen gas atmosphere, a mixed gas atmosphere of hydrogen and nitrogen that are represented by forming gas, a nitrogen atmosphere containing formic acid gas, mixed gas atmosphere of hydrogen and rare gas, a rare gas atmosphere containing formic acid gas, and the like.

A temperature at the time of performing the heating treatment (the highest achieving temperature) may be higher than or equal to 170° C., may be higher than or equal to 190° C., or may be higher than or equal to 200° C., and may be lower than or equal to 250° C., may be lower than 250° C., may be lower than or equal to 225° C., or may be lower than 225° C., from the viewpoint of enabling a thermal damage with respect to the member (the first member 2 and the second member 3) to be reduced and from the viewpoint of improving a yield ratio. For example, the highest achieving temperature may be 170° C. to 250° C., may be higher than or equal to 170° C. and lower than 250° C., may be 190° C. to 225° C., may be higher than or equal to 190° C. and lower than 225° C., may be 200° C. to 225° C., or may be higher than or equal to 200° C. and lower than 225° C. In this embodiment, the metal paste 10 for joints described above is used, and thus, even in a case where the highest achieving temperature is lower than or equal to 250° C., a sufficient joining strength is obtained. In a case where the highest achieving temperature is higher than or equal to 200° C., the sintering tends to be sufficiently performed by setting a highest achieving temperature retention time to be shorter than or equal to 60 minutes. In the case of containing the solvent component, the highest achieving temperature may be a temperature lower than the boiling point of the solvent component at 1 atm. In such a case, it is possible to volatilize and remove the solvent component by a vapor pressure of the solvent component. Furthermore, even in a case where the highest achieving temperature is higher than or equal to 170° C. and lower than 200° C., the highest achieving temperature retention time is set to be longer than 60 minutes and shorter than or equal to 120 minutes, and thus, the sintering tends to be sufficiently performed. In this embodiment, the temperature at the time of performing the heating treatment (the highest achieving temperature) is lower than or equal to 250° C., but it is possible to perform the heating treatment in a condition of higher than or equal to 280° C. and lower than or equal to 400° C., for the purpose of improving reliability in a reliability test such as a temperature cycle test and a power cycle test.

The highest achieving temperature retention time may be longer than or equal to 1 minute, and may be shorter than or equal to 120 minutes, may be shorter than or equal to 60 minutes, may be shorter than 40 minutes, or may be shorter than 30 minutes, from the viewpoint of volatilizing all of the volatile components (for example, the monovalent aliphatic alcohol and the solvent component), and of improving the yield ratio. That is, the highest achieving temperature retention time may be 1 minute to 120 minutes, may be 1 minute to 60 minutes, may be longer than or equal to 1 minute and shorter than 40 minutes, or may be longer than or equal to 1 minute and shorter than 30 minutes.

Even in a case where the joints are performed without a pressure at the time of sintering the laminated body 50, the assembly is capable of having a sufficient joining strength by using the metal paste 10 for joints this embodiment. That is, even in a case where the laminated body 50 is sintered in a state of receiving only the self-weight of the first member 2 laminated on the metal paste 10 for joints, or in a state of receiving a pressure of less than or equal to 0.01 MPa, preferably less than or equal to 0.005 MPa, in addition to the self-weight of the first member 2, it is possible to obtain a sufficient joining strength. In a case where the pressure that is received at the time of performing the sintering is within the range described above, a special pressurization device is not necessary, and thus, it is possible to reduce the void, and to further improve the die shear strength and the connection reliability, without impairing the yield ratio. Examples of a method of receiving a pressure of less than or equal to 0.01 MPa by the metal paste 10 for joints include a method of placing a weight on the member (for example, the first member 2) that is arranged on a vertical upper side, and the like.

Figure 4:
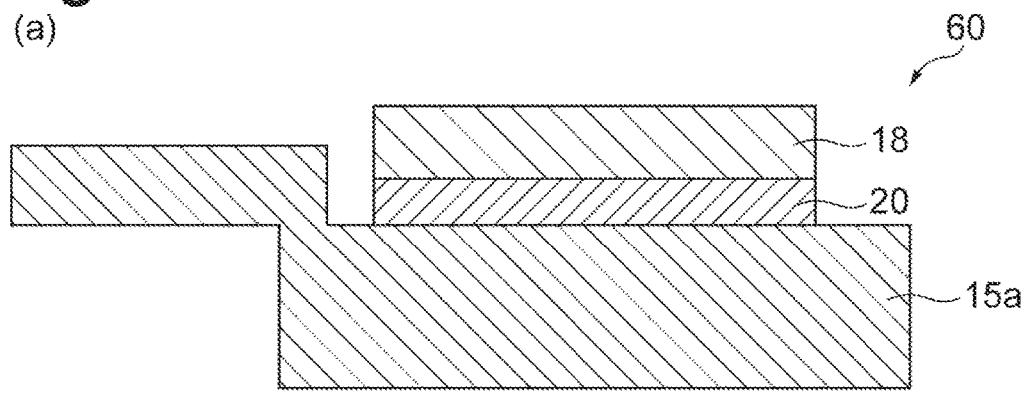
FIG. 4(a)-(c) is a schematic sectional view for illustrating a production method for the semiconductor device illustrated in FIG. 2.
Figure 4:
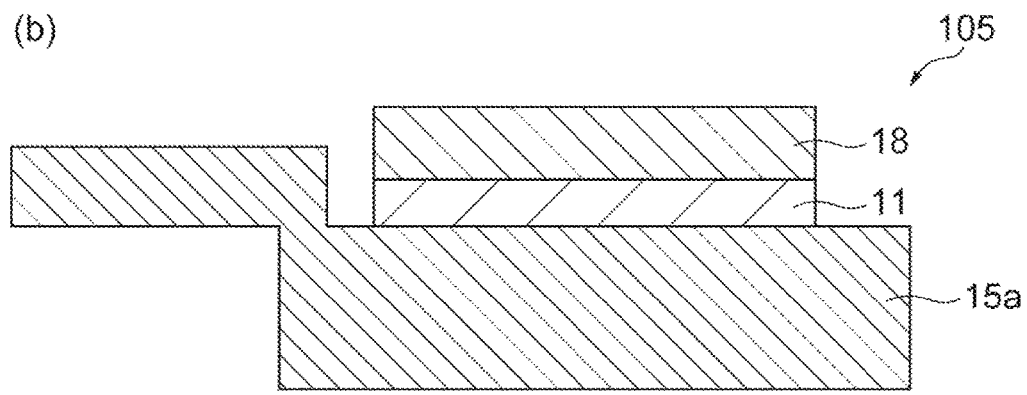
Figure 4:
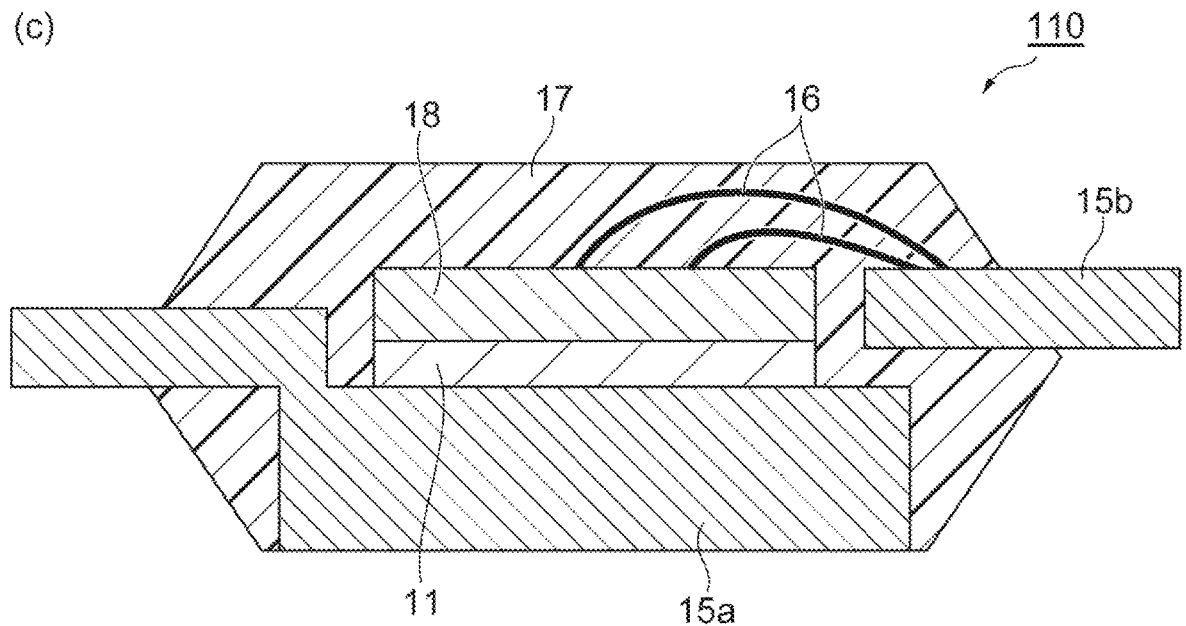

The semiconductor device according to this embodiment can be produced by the same method as the production method for the assembly 100 described above. That is, the production method for the semiconductor device includes a step of preparing a laminated body in which the first member, and the metal paste for joints described above, and the second member are laminated in this order in the direction side in which the self-weight of the first member acts, by using the semiconductor element in at least one of the first member and the second member, and of sintering the metal paste for joints at a temperature of lower than or equal to 250° C., in a state of receiving the self-weight of the first member or in a state or receiving the self-weight of the first member and a pressure of less than or equal to 0.01 MPa. For example, as illustrated in FIG. 4 (FIG. 4(*a*) to FIG. 4(*c*)), a laminated body 60 is obtained by providing a metal paste 20 for joints on the lead frame 15*a*, and by arranging the semiconductor element 18 (FIG. 4(*a*)), and then, an assembly 105 is obtained by heating the laminated body 60, and by sintering the metal paste 20 for joints (FIG. 4(*b*)). Next, the lead frame 15*b* and the semiconductor element 18 in the obtained assembly 105 are connected by the wire 16, and are sealed with a sealing resin. According to such a step, the semiconductor device 110 is obtained (FIG. 4(*c*)). Even in a case where the joints are performed without a pressure, the obtained semiconductor device 110 is capable of having a sufficient die shear strength and sufficient connection reliability. The semiconductor device of this embodiment includes the sintered body of the metal paste for joints that has a sufficient joining force, and contains copper having a high thermal conductivity and a high melting point, and thus, is capable of having a sufficient die shear strength, can be excellent in the connection reliability, and can also be excellent in power cycle resistance.

As described above, an example of the assembly and the semiconductor device that are produced by using the metal paste for joints of this embodiment has been described, but the assembly and the semiconductor device that are by using the metal paste for joints of this embodiment are not limited to the embodiment described above. The assembly that is produced by using the metal paste for joints of this embodiment, for example, may be an assembly illustrated in FIG. 5 and FIG. 7.

Figure 5:
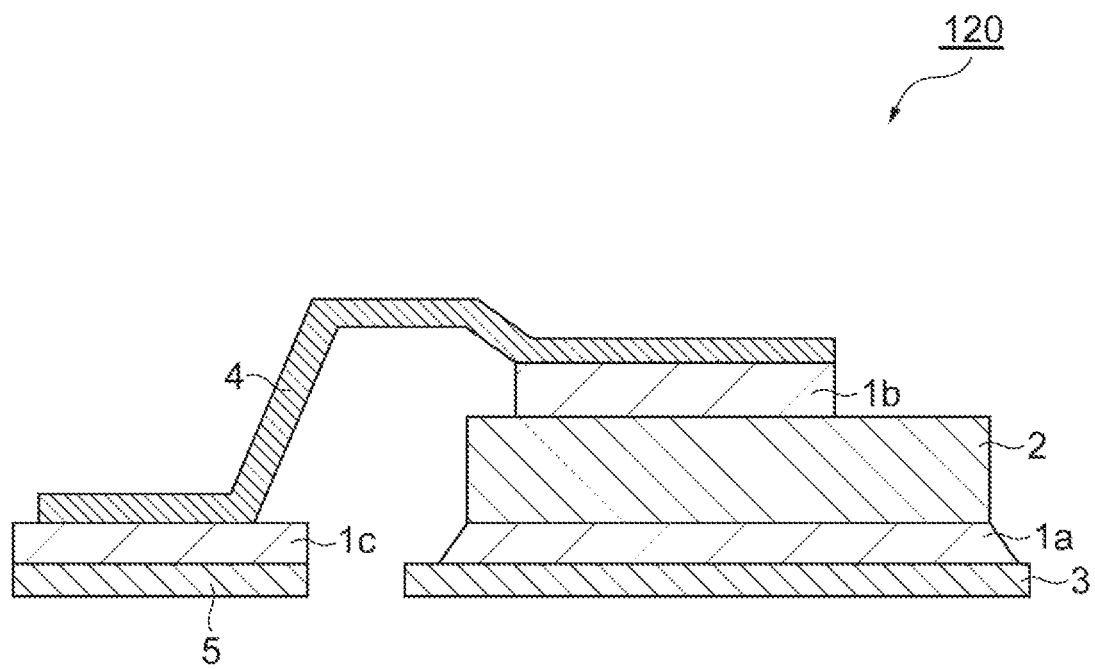
FIG. 5 is a schematic sectional view illustrating an example of an assembly that is produced by using a metal paste for joints of this embodiment.

An assembly 120 illustrated in FIG. 5 includes the first member 2, the second member 3, a third member 4, a fourth member 5, a sintered body 1*a* of the metal paste for joints that joins the first member 2 and the second member 3 together, a sintered body 1*b* of the metal paste for joints that joins the first member 2 and the third member 4 together, and a sintered body 1*c* of the metal paste for joints that joins the third member 4 and the fourth member 5 together.

Figure 6:
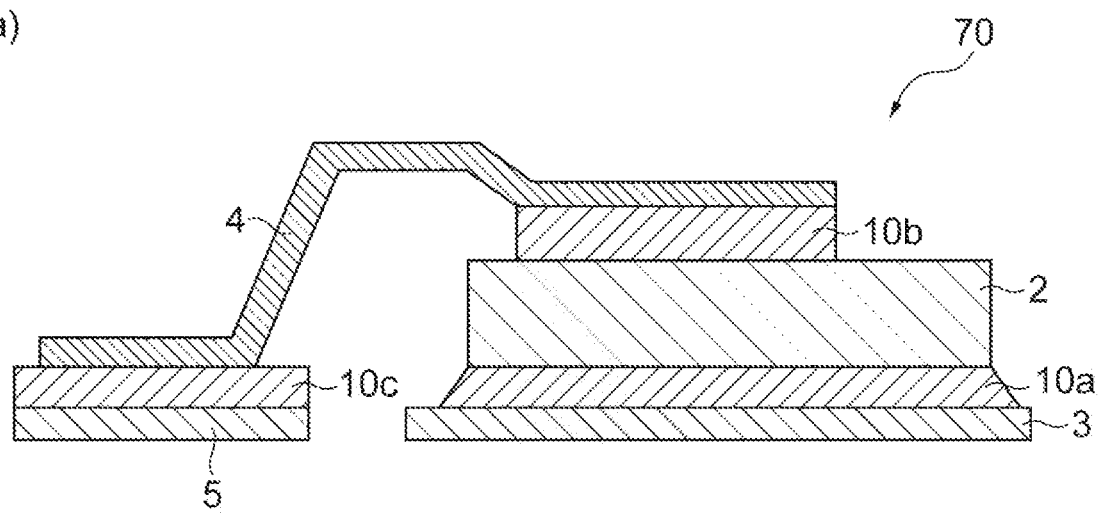
FIG. 6(a)-(b) is a schematic sectional view for illustrating a production method for the assembly illustrated in FIG. 5.
Figure 6:
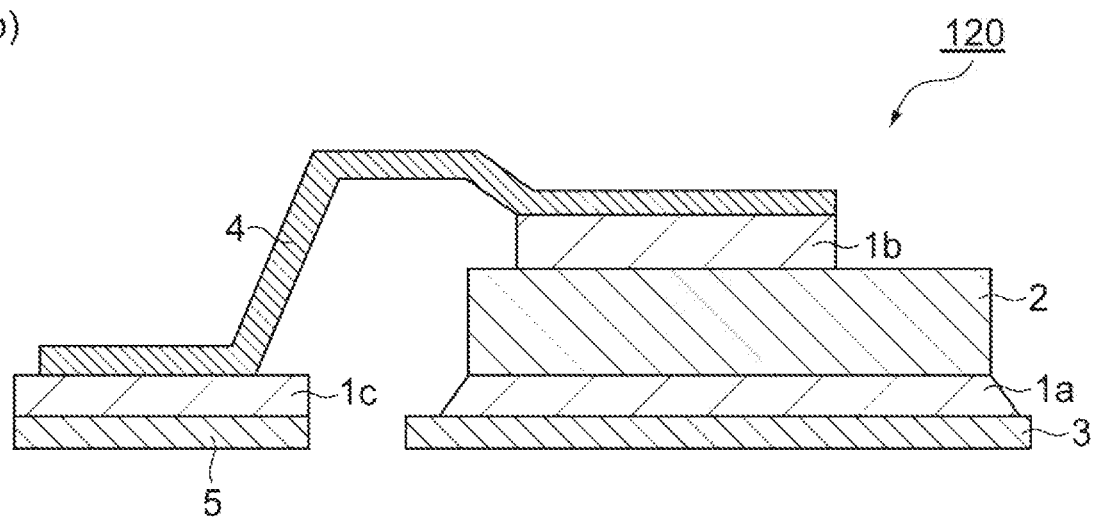

For example, as illustrated in FIG. 6 (FIG. 6(*a*) and FIG. 6(*b*)), such an assembly 120 can be obtained by a method including a step of preparing a laminated body 70 including a laminated portion in which the third member 4, a second metal paste 10*b* for joints, the first member 2, a first metal paste 10*a* for joints, and the second member 3 are laminated in this order in a direction side in which the self-weight of the third member 4 acts, and a laminated portion in which the third member 4, a third metal paste 10*c* for joints, and the fourth member 5 are laminated in this order in the direction side in which the self-weight of the third member 4 acts (FIG. 6(*a*)), and of sintering the first metal paste 10*a* for joints, the second metal paste 10*b* for joints, and the third metal paste 10*c* for joints, as with the production method for the assembly 100 described above (FIG. 6(*b*)). In the method described above, the first metal paste 10*a* for joints, the second metal paste 10*b* for joints, and the third metal paste 10*c* for joints are the metal paste for joints according to this embodiment, the sintered body 1*a* is obtained by sintering the first metal paste 10*a* for joints, the sintered body 1*b* is obtained by sintering the second metal paste 10*b* for joints, and the sintered body 1*c* is obtained by sintering the third metal paste 10*c* for joints.

In addition, the assembly 120, for example, can be obtained by a method including a step of forming a laminated portion in which the third member 4, the second metal paste 10*b* for joints, and the first member 2 are laminated in this order in the direction side in which the self-weight of the third member 4 acts, and a laminated portion in which in which the third member 4, the third metal paste 10*c* for joints, and the fourth member 5 are laminated in this order in the direction side in which the self-weight of the third member 4 acts, after the assembly 100 described above is obtained, and of sintering the second metal paste 10*b* for joints and the third metal paste 10*c* for joints, as with the production method for the assembly 100 described above.

Figure 7:
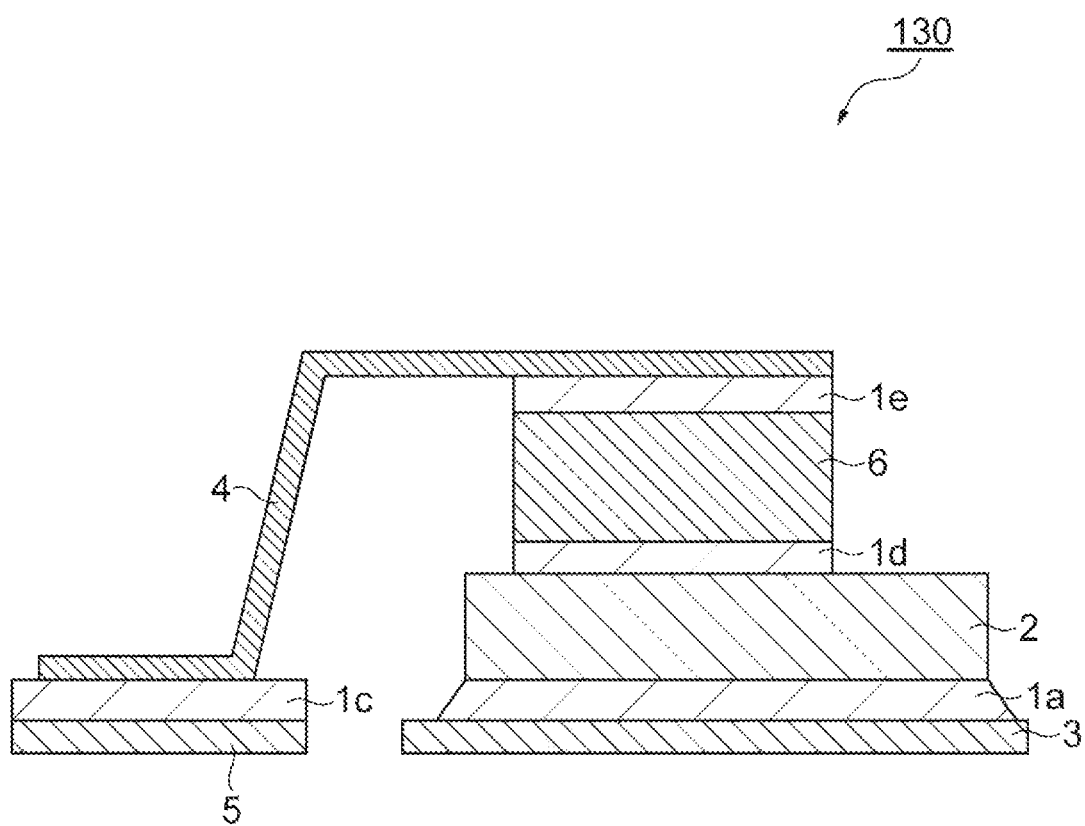
FIG. 7 is a schematic sectional view illustrating an example of an assembly that is produced by using a metal paste for joints of this embodiment.

An assembly 130 illustrated in FIG. 7 includes the first member 2, the second member 3, the third member 4, the fourth member 5, a fifth member 6, the sintered body 1*a* of the metal paste for joints that joins the first member 2 and the second member 3 together, the sintered body 1*c* of the metal paste for joints that joins the third member 4 and the fourth member 5 together, a sintered body 1*d* of the metal paste for joints that joins the first member 2 and the fifth member 6 together, and a sintered body 1*e* of the metal paste for joints that joins the third member 4 and the fifth member 6 together.

Figure 8:
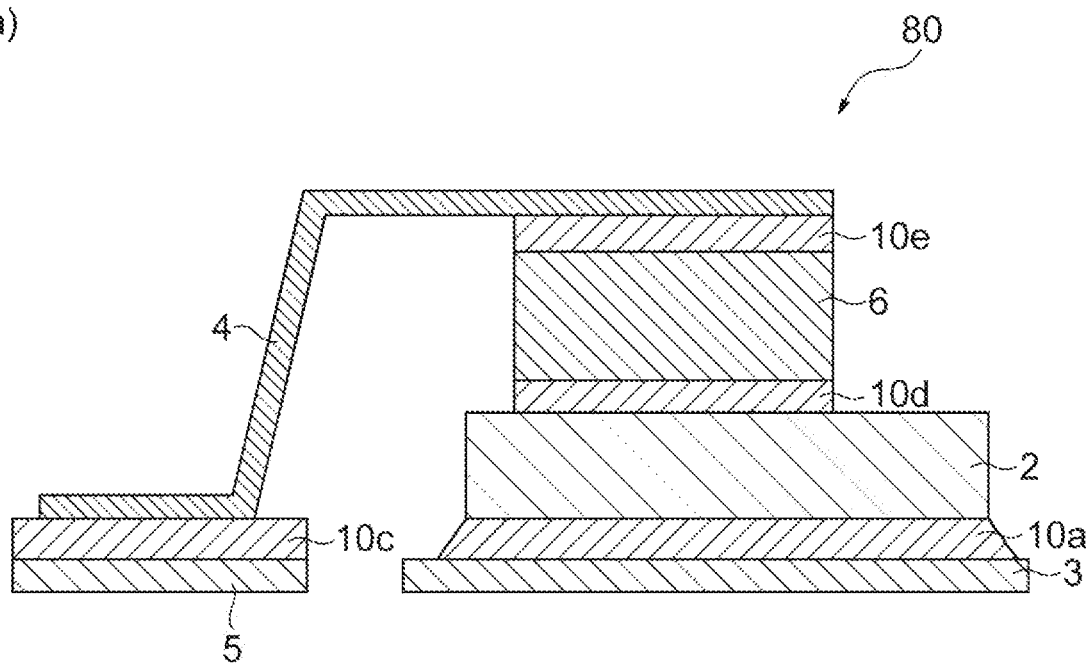
FIG. 8(a)-(b) is a schematic sectional view for illustrating a production method for the assembly illustrated in FIG. 7.
Figure 8:
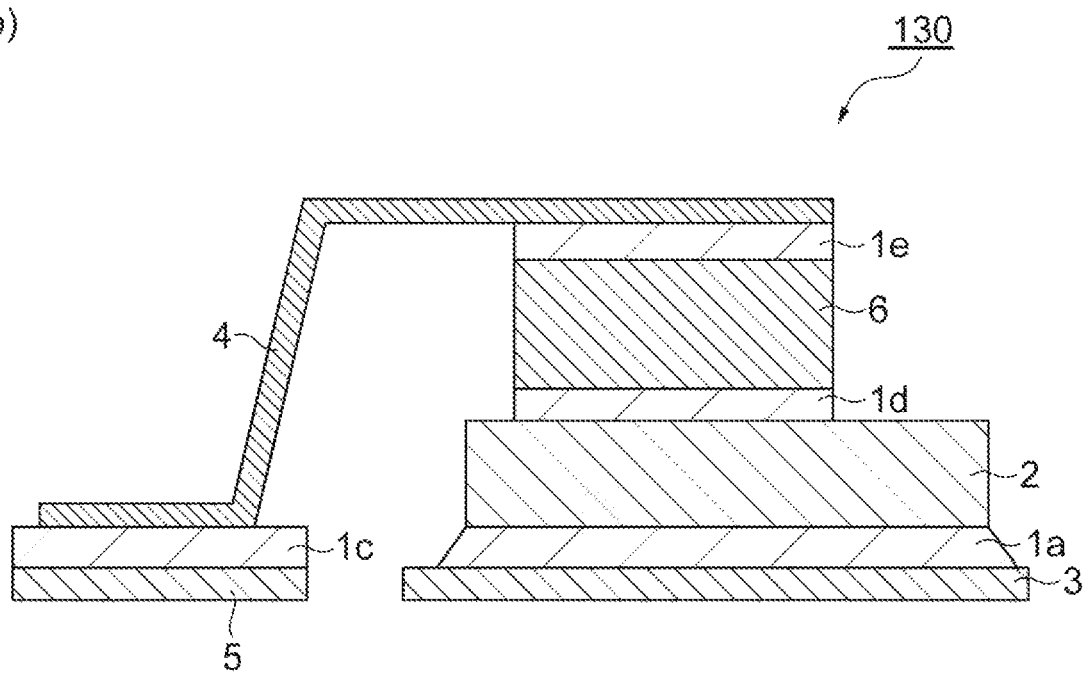

For example, as illustrated in FIG. 8 (FIG. 8(*a*) and FIG. 8(*b*)), such an assembly 130 can be obtained by a method including a step of preparing a laminated body 80 including a laminated portion in which the third member 4, a fifth metal paste 10*e* for joints, the fifth member 6, a fourth metal paste 10*d* for joints, the first member 2, the first metal paste 10*a* for joints, and the second member 3 are laminated in this order in the direction side in which the self-weight of the third member 4 acts, and a laminated portion in which the third member 4, the third metal paste 10*c* for joints and the fourth member 5 are laminated in this order in the direction side in which the self-weight of the third member 4 acts (FIG. 8(*a*)), and of sintering the first metal paste 10*a* for joints, the third metal paste 10*c* for joints, the fourth metal paste 10*d* for joints, and the fifth metal paste 10*e* for joints, as with the production method for the assembly 100 described above (FIG. 8(*b*)). In the method described above, the first metal paste 10*a* for joints, the third metal paste 10*c* for joints, the fourth metal paste 10d for joints, and the fifth metal paste 10e for joints are the metal paste for joints according to this embodiment, the sintered body 1a is obtained by sintering the first metal paste 10a for joints, the sintered body 1c is obtained by sintering the third metal paste 10c for joints, the sintered body 1d is obtained by sintering the fourth metal paste 10d for joints, and the sintered body 1e is obtained by sintering the fifth metal paste 10e for joints.

In addition, the assembly 130 can be obtained by a method including a step of preparing a laminated body in which the third member 4, the fifth metal paste 10e for joints, the fifth member 6, the fourth metal paste 10d for joints, the first member 2, the first metal paste 10a for joints, and the second member 3 are laminated in this order in the direction side in which the self-weight of the third member 4 acts, of sintering the first metal paste 10a for joints, the fourth metal paste 10d for joints, and the fifth metal paste 10e for joints, as with the production method for the assembly 100 described above, and then, of forming a laminated portion in which the third member 4, the third metal paste 10c for joints, and the fourth member 5 are laminated in this order in the direction side in which the self-weight of the third member 4 acts, and of sintering the third metal paste 10c for joints, as with the production method for the assembly 100 described above.

In addition, the assembly 130 can be obtained by a method including a step of forming a laminated portion in which the third member 4, the fifth metal paste 10e for joints, the fifth member 6, the fourth metal paste 10d for joints, and the first member 2 are laminated in this order in the direction side in which the self-weight of the third member 4 acts, and a laminated portion in which the third member 4, the third metal paste 10c for joints, and the fourth member 5 are laminated in this order in the direction side in which the self-weight of the third member 4 acts, and of sintering the third metal paste 10c for joints, the fourth metal paste 10d for joints, and the fifth metal paste 10e for joints, as with the production method for the assembly 100 described above, after the assembly 100 described above is obtained.

In the modification example described above, an example of the third member 4, the fourth member 5, and the fifth member 6 is identical to an example of the second member 3. In addition, the surface of the third member 4, the fourth member 5, and the fifth member 6 that is in contact with the sintered body of the metal paste for joints may contain a metal. An example of the metal to be contained is identical to an example of the metal to be contained in the surface of the first member 2 and the second member 3 that is in contact with the sintered body of the metal paste for joints. In addition, the first metal paste 10a for joints, the second metal paste 10b for joints, the third metal paste 10c for joints, the fourth metal paste 10d for joints, and the fifth metal paste 10e for joints used in the modification example described above may be identical to each other, or may be different from each other.

EXAMPLES

Hereinafter, the present invention will be more specifically described by examples. However, the present invention is not limited to the following examples.

In examples and comparative examples, the following materials were used.

[Metal Particles]
CH-0200 (manufactured by Mitsui Mining & Smelting Co., Ltd., Shape: Pseudospherical Shape, Surface Treatment Agent: Lauric Acid (Dodecanoate), Surface Treatment Amount: 0.973 Mass % (Based on Total Mass of CH-0200), 50% Volume Average Particle Diameter: 0.36 μm, and Content of Copper Particles Having Particle Diameter (Maximum Diameter) of Greater than or Equal to 0.1 μm and Less than 1 μm: 100 Mass %)

2L3N/A (manufactured by Fukuda Metal Foil & Powder Co., Ltd., Shape: Flake Shape, Surface Treatment Amount: 0.8 Mass % (Based on Total Mass of 2L3N/A), 50% Volume Average Particle Diameter: 9.4 μm, BET Specific Surface Area: 13400 $cm^2$/g, Aspect Ratio: 5.25, Content of Copper Particles Having Particle Diameter (Maximum Diameter) of Greater than or Equal to 1 μm and Less than 50 μm: 100 Mass %, and Content of Copper Particles Having Maximum Diameter of 2 μm to 50 μm: 100 Mass %)

Zinc Particles (Product Number: 13789, manufactured by Thermo Fisher Scientific Inc.)

[Monovalent Aliphatic Alcohol]
Methanol (manufactured by Wako Pure Chemical Corporation)
Ethanol (manufactured by Wako Pure Chemical Corporation)
1-Propanol (manufactured by Wako Pure Chemical Corporation)
1-Heptanol (manufactured by Wako Pure Chemical Corporation)
1-Tetradecanol (manufactured by Wako Pure Chemical Corporation)
t-Butyl Alcohol (manufactured by Wako Pure Chemical Corporation)
2-Propanol (manufactured by Wako Pure Chemical Corporation)
2-Heptanol (manufactured by Wako Pure Chemical Corporation)
Isooctadecanol (Product Name: FINEOXOCOL 180 ("FINEOXOCOL" Is Registered Trademark), manufactured by Nissan Chemical Corporation)

[Components Other than Metal Particles and Monovalent Aliphatic Alcohol]
α-Terpineol (manufactured by Wako Pure Chemical Corporation)
Tributyrin (manufactured by Wako Pure Chemical Corporation)
Dodecyl Amine (manufactured by Wako Pure Chemical Corporation)
N,N-Dimethyl Formamide (manufactured by Wako Pure Chemical Corporation)
Ethyl Acetate (manufactured by Wako Pure Chemical Corporation)
Arachidic Acid (manufactured by Tokyo Chemical Industry Co., Ltd.)
Acetonitrile (manufactured by Wako Pure Chemical Corporation)
Water (Ultrapure Water, manufactured by Wako Pure Chemical Corporation)

Example 1

<Preparation of Metal Paste 1 for Joints>
0.36 g of α-terpineol, 0.17 g of tributyrin, 0.017 g of methanol, 3.12 g of CH-0200, and 1.34 g of 2L3N/A were added to an agate mortar, and were kneaded until a dry powder disappeared, and a mixed liquid was moved to a polyethylene bottle (a polyethylene container). The polyethylene bottle with an airtight stopper was stirred at 2000 min$^{-1}$ (2000 rotations/minute) for 2 minutes by using a rotation and revolution type stirring device (Planetary Vacuum Mixer ARV-310, manufactured by THINKY CORPORATION). After that, the obtained mixed liquid, and 0.0088 g of zinc particles (Product Number: 13789, manufactured by Thermo Fisher Scientific Inc.) were added to an agate mortar, and were kneaded until a dry powder disappeared, and a mixed liquid was moved to a polyethylene bottle. The polyethylene bottle with an airtight stopper was stirred at 2000 min$^{-1}$ (2000 rotations/minute) for 2 minutes by using a rotation and revolution stirring device (Planetary Vacuum Mixer ARV-310, manufactured by THINKY CORPORATION). The obtained paste-like mixed liquid was set to a metal paste 1 for joints. As shown in Table 1, the content of the monovalent aliphatic alcohol in the metal paste 1 for joints was 0.38 part by mass with respect to 100 parts by mass of the metal particles. Furthermore, "Total Amount of Metal Particles" in Table 1 is an amount excluding the amount of the surface treatment agent.

<Production of Assembly>

An assembly of Example 1 was produced by using the metal paste 1 for joints, in accordance with the following method.

First, a stainless steel metal mask (Thickness: 100 μm) having square openings of 3 mm×3 mm in 3 rows and 3 columns was placed on a copper plate (Total Thickness: 3 mm, and Plating Thickness: 3 μm to 5 μm) of 19 mm×25 mm that was subjected to electrolytic nickel plating, and the metal paste 1 for joints was applied onto the copper plate by stencil printing using a metal squeegee. Next, a silicon chip was prepared in which titanium and nickel were subjected to a sputtering treatment in this order with respect to a silicon chip (Thickness: 400 μm) of 3 mm×3 mm, and the silicon chip was placed on the applied metal paste for joints such that nickel was in contact with the metal paste for joints. The silicon chip adhered to the metal paste for joints by being pressed lightly with tweezers. The obtained laminated body was set in a tube furnace (manufactured by AVC Co., LTD), and argon gas flowed into the tube furnace at 3 L/min, and thus, the air in the tube furnace was substituted with the argon gas. After that, the temperature of the tube furnace was raised to 200° C. for 30 minutes while hydrogen gas flowed into the tube furnace at 500 ml/min. After the temperature was raised, a sintering treatment was performed in a condition of performing sintering at a highest achieving temperature of 200° C. (the measurement of the copper plate subjected to the electrolytic nickel plating) for a highest achieving temperature retention time of 60 minutes, and thus, an assembly was obtained in which the copper plate subjected to the nickel plating, and the silicon chip of which nickel is subjected to the sputtering treatment were joined together. After the sintering, cooling was performed by changing an inflow velocity of the argon gas to 0.3 L/min, and the assembly was taken out to the air at a temperature of lower than or equal to 50° C. According to such operations, the assembly of Example 1 was obtained by sintering the metal paste 1 for joints without performing pressurization.

Example 2

A paste-like mixed liquid was prepared as with Example 1 except that 0.35 g of α-terpineol and 0.028 g of methanol were used, and was set to metal paste 2 for joints. Next, an assembly of Example 2 was produced as with Example 1 except that the metal paste 2 for joints was used instead of the metal paste 1 for joints.

Example 3

A paste-like mixed liquid was prepared as with Example 1 except that 0.32 g of α-terpineol was used, and 0.055 g of methanol was used, and was set to a metal paste 3 for joints. Next, an assembly of Example 3 was produced as with Example 1 except that the metal paste 3 for joints was used instead of the metal paste 1 for joints.

Example 4

A paste-like mixed liquid was prepared as with Example 1 except that 0.30 g of α-terpineol was used, and 0.077 g of methanol was used, and was set to a metal paste 4 for joints. Next, an assembly of Example 4 was produced as with Example 1 except that the metal paste 4 for joints was used instead of the metal paste 1 for joints.

Examples 5 to 12 and Comparative Examples 1 to 5

A paste-like mixed liquid was prepared as with Example 2 except that components other than alcohol or monovalent aliphatic alcohol shown in Table 1 to Table 3 (dodecyl amine, N,N-dimethyl sulfoamide, ethyl acetate, acetonitrile, or water) were used instead of methanol, and was set to metal pastes 5 to 17 for joints. Next, assemblies of Examples 5 to 12 and Comparative Examples 1 to 5 were produced as with Example 1 except that the metal pastes 5 to 17 for joints were used instead of the metal paste 1 for joints. Furthermore, the content of each of the components other than the monovalent aliphatic alcohol in the metal pastes 13 to 17 for joints (dodecyl amine, N,N-dimethyl sulfoamide, ethyl acetate, acetonitrile, or water) was 0.63 part by mass with respect to 100 parts by mass of the metal particles.

Comparative Example 6

A paste-like mixed liquid was prepared as with Example 1 except that methanol was not used, and 0.38 g of α-terpineol was used, and was set to a metal paste 18 for joints. Next, an assembly of Comparative Example 6 was produced as with Example 1 except that the metal paste 18 for joints was used instead of the metal paste 1 for joints.

Example 13

A paste-like mixed liquid was prepared as with Example 7 except that the zinc particles were not used, and the used amounts of CH-0200, 2L3NA, the monovalent aliphatic alcohol (1-heptanol), and the tributyrin were changed to values shown in Table 2, and was set to a metal paste 19 for joints. Next, an assembly of Example 13 was produced as with Example 1 except that the metal paste 19 for joints was used instead of the metal paste 1 for joints.

Comparative Example 7

A paste-like mixed liquid was prepared as with Example 1 except that an arachidic acid was used instead of methanol, and the used amounts of CH-0200, 2L3NA, the arachidic acid, and the tributyrin were changed to values shown in Table 4, and was set to a metal paste 20 for joints. Next, an assembly of Comparative Example 7 was produced as with Example 1 except that the metal paste 20 for joints was used instead of the metal paste 1 for joints.

<Evaluation>

A die shear strength of the assembly, and a 50% volume average particle diameter of the metal paste for joints before and after being stored for 84 hours were measured in accordance with the following procedure.

(Die Shear Strength)

The joining strength of the assembly was evaluated by a die shear strength. The die shear strength of the assembly was measured by pressing a copper block in a horizontal direction at a measurement speed of 5 mm/min and a measurement height of 50 μm by using a universal bonding tester (Royce 650, manufactured by Royce Instruments) provided with a load cell (SMS-200K-24200, manufactured by Royce Instruments). An average value of values obtained by measuring eight assemblies was set to the die shear strength. Results are shown in Tables 1 to 4.

(50% Volume Average Particle Diameter of Metal Paste for Joints)

The metal paste 2 for joints was put into a glass sample tube (Product Number: 9-852-09, manufactured by AS ONE Corporation). The 50% volume average particle diameter of the paste was measured for 12 hours while the paste was prepared, and thus, the 50% volume average particle diameter was 5.6 μm. Further, the paste was stored at humidity of 60% and 25° C. for 84 hours. The 50% volume average particle diameter of the paste was measured, and thus, the 50% volume average particle diameter was 6.6 μm. From such results, it was confirmed that a change in the 50% volume average particle diameter of the metal paste 2 for joints was within 20%. Furthermore, the 50% volume average particle diameter was measured in accordance with (1) to (5) described below, by using a Shimadzu nanoparticle diameter distribution measurement device (SALD-7500nano, manufactured by Shimadzu Corporation) and software attached thereto (WingSALDII-7500-for Japanese V3., manufactured by Shimadzu Corporation).

(1) Setting of Software

WingSALDII-7500-for Japanese V3.1 was activated by a personal computer attached to a measurement device, and the device was initialized by pressing a manual. After the initialization was ended, a saved file name was designated, "Next" was clicked, a measurement condition and a particle diameter distribution calculation condition were set as follows, and "Next" was clicked.

(Measurement Condition)

Detection of Diffraction/Scattering Light

Average Number of Times (Number of Times of Measurement: 1): 128, Number of Times of Measurement: 1, and Measurement Interval (Second): 2

Measurement Light Absorption Range

Maximum Value: 0.2 and Minimum Value: 0

Blank Region/Measurement Region

Blank Measurement Acceptable Variation Maximum Value: 150, Measurement Optimal Range (MAX): 45000, and Measurement Optimal Range (MIN): 15000

(Particle Diameter Distribution Calculation Condition)

Selection of Refractive Index: Reference Sample/Pure Metal/Semiconductor and Others (Solid Value)

Substance of Sample: 4 Copper Selection of Refractive Index: 1.18-2.21, Check "Evaluate Lateral/Rear Sensor"

(2) Blank Measurement

A batch cell (SALD-BC75, manufactured by Shimadzu Corporation) for a Shimadzu nanoparticle diameter distribution measurement device SALD-7500nano was attached to SALD-7500nano, and measurement was performed. α-terpineol (manufactured by Wako Pure Chemical Corporation) was dropped into a batch cell (Component Number of S347-61030-41, manufactured by Shimadzu Corporation, hereinafter, referred to as a "batch cell") with a funnel attached to SALD-BC75 by a dropper to fall between two gauge lines of the batch cell. "Dianosis" and "Adjustment" were selected from a screen of WingSALDII-7500-for Japanese V3., and it was confirmed that position sensor output was within a device acceptable range. "Cancel" was clicked, and the screen was returned to the original state, the blank measurement was selected, and the measurement was performed.

(3) Preparation of Measurement Solution 2 mg of the metal paste for joints to be measured was placed on a stirring lever of a batch cell holder (Component NumberS347-62301, manufactured by Shimadzu Corporation) attached to SALD-BC75, and a batch cell with a funnel was set. Next, "Stirrer" was selected from the screen of WingSALDII-7500-for Japanese V3., and stirring was performed for 15 minutes.

(4) Measurement

After the stirring, "Measurement" was selected from the screen of WingSALDII-7500-for Japanese V3., and the measurement was performed. The operations of (1) to (4) were repeated four times, and the measurement was performed four times.

(5) Statistics

WingSALDII-7500-for Japanese V3. was activated, "Opening" was clicked, the measured file was selected, and measurement data was displayed on the screen of WingSALDII-7500-for Japanese V3. "Overwriting" was clicked, 50.000% diameter was displayed at the bottom of the screen, and the average value of four times was set to the 50% volume average particle diameter.

TABLE 1

|  |  | Example 1 | Example 2 | Example 3 | Example 4 | Example 5 | Example 6 | Example 7 |
| --- | --- | --- | --- | --- | --- | --- | --- | --- |
| CH-0200 | Added | 3.12 | 3.12 | 3.12 | 3.12 | 3.12 | 3.12 | 3.12 |
| 2L3N/A | amount | 1.34 | 1.34 | 1.34 | 1.34 | 1.34 | 1.34 | 1.34 |
| Zinc particles | (g) | 0.0088 | 0.0088 | 0.0088 | 0.0088 | 0.0088 | 0.0088 | 0.0088 |
| Monovalent aliphatic alcohol |  | 0.017 | 0.028 | 0.055 | 0.077 | 0.028 | 0.028 | 0.028 |
| α-Terpineol |  | 0.36 | 0.35 | 0.32 | 0.30 | 0.35 | 0.35 | 0.35 |
| Tributyrin |  | 0.17 | 0.17 | 0.17 | 0.17 | 0.17 | 0.17 | 0.17 |
| Type of alcohol |  | Methanol | Methanol | Methanol | Methanol | Ethanol | 1-Propanol | 1-Heptanol |
| Total amount (g) of metal particles |  | 4.43 | 4.43 | 4.43 | 4.43 | 4.43 | 4.43 | 4.43 |
| Content of monovalent aliphatic alcohol (parts by mass with respect to 100 parts by mass of metal particles) |  | 0.38 | 0.63 | 1.24 | 1.74 | 0.63 | 0.63 | 0.63 |
| Die shear strength (MPa) at 25° C. |  | 15 | 19 | 17 | 19 | 22 | 22 | 26 |

TABLE 2

|  |  | Example 8 | Example 9 | Example 10 | Example 11 | Example 12 | Example 13 |
|---|---|---|---|---|---|---|---|
| CH-0200 | Added | 3.12 | 3.12 | 3.12 | 3.12 | 3.12 | 2.87 |
| 2L3N/A | amount | 1.34 | 1.34 | 1.34 | 1.34 | 1.34 | 1.53 |
| Zinc particles | (g) | 0.0088 | 0.0088 | 0.0088 | 0.0088 | 0.0088 | 0 |
| Monovalent aliphatic alcohol |  | 0.028 | 0.028 | 0.028 | 0.028 | 0.028 | 0.028 |
| α-Terpineol |  | 0.35 | 0.35 | 0.35 | 0.35 | 0.35 | 0.51 |
| Tributyrin |  | 0.17 | 0.17 | 0.17 | 0.17 | 0.17 | 0.15 |
| Type of alcohol |  | 1-Tetradecanol | t-Butyl alcohol | 2-Propanol | 2-Heptanol | Isooctadecanol | 1-Heptanol |
| Total amount (g) of metal particles |  | 4.43 | 4.43 | 4.43 | 4.43 | 4.43 | 4.36 |
| Content of monovalent aliphatic alcohol (parts by mass with respect to 100 parts by mass of metal particles) |  | 0.63 | 0.63 | 0.63 | 0.63 | 0.63 | 0.64 |
| Die shear strength (MPa) at 25° C. |  | 23 | 20 | 17 | 17 | 20 | 19 |

TABLE 3

|  |  | Comparative Example 1 | Comparative Example 2 | Comparative Example 3 | Comparative Example 4 | Comparative Example 5 | Comparative Example 6 |
|---|---|---|---|---|---|---|---|
| CH-0200 | Added | 3.12 | 3.12 | 3.12 | 3.12 | 3.12 | 3.12 |
| 2L3N/A | amount | 1.34 | 1.34 | 1.34 | 1.34 | 1.34 | 1.34 |
| Zinc particles | (g) | 0.0088 | 0.0088 | 0.0088 | 0.0088 | 0.0088 | 0.0088 |
| Dodecyl amine |  | 0.028 | — | — | — | — | — |
| N,N-Dimethyl sulfoamide |  | — | 0.028 | — | — | — | — |
| Ethyl acetate |  | — | — | 0.028 | — | — | — |
| Acetonitrile |  | — | — | — | 0.028 | — | — |
| Water |  | — | — | — | — | 0.028 | — |
| α-Terpineol |  | 0.35 | 0.35 | 0.35 | 0.35 | 0.35 | 0.38 |
| Tributyrin |  | 0.17 | 0.17 | 0.17 | 0.17 | 0.17 | 0.17 |
| Total amount (g) of metal particles |  | 4.43 | 4.43 | 4.43 | 4.43 | 4.43 | 4.43 |
| Die shear strength (MPa) at 25° C. |  | 4 | 13 | 12 | 14 | 14 | 12 |

TABLE 4

|  |  | Comparative Example 7 |
|---|---|---|
| CH-0200 | Added | 2.87 |
| 2L3N/A | Amount | 1.53 |
| Zinc particles | (g) | 0.0088 |
| Arachidic acid |  | 0.028 |
| α-Terpineol |  | 0.51 |
| Tributyrin |  | 0.15 |
| Total amount (g) of metal particles |  | 4.37 |
| Content of arachidic acid (parts by mass with respect to 100 parts by mass of metal particles) |  | 0.64 |
| Die shear strength (MPa) at 25° C. |  | 6 |

In comparison between the examples with the comparative examples, it is known that in a case where the metal paste for joints contains the monovalent aliphatic alcohol, the die shear strength is greater than or equal to 15 MPa even in a case where the highest achieving temperature at the time of performing the heating is 200° C. On the other hand, in a case where the components other than the monovalent aliphatic alcohol (amine, amide, ester, nitrile, water, and the arachidic acid) are added, and the monovalent aliphatic alcohol is not added, the die shear strength was less than 15 MPa.

REFERENCE SIGNS LIST

1, 1a, 1b, 1c, 1d, 1e, 11: sintered body of metal paste for joints, 2: first member, 3: second member, 10, 10a, 10b, 10c, 10d, 10e, 20: metal paste for joints, 15a, 15b: lead frame, 16: wire, 17: mold resin, 18: semiconductor element, 50, 60, 70, 80: laminated body, 100, 105, 120, 130: assembly, 110: semiconductor device.

The invention claimed is:

1. A metal paste for joints, comprising:

metal particles; and linear or branched monovalent aliphatic alcohol having 1 to 20 carbon atoms, wherein the metal particles comprise sub-micro copper particles having a volume average particle diameter of 0.12 μm to 0.8 μm and at least one type of metal particles selected from the group consisting of zinc and silver, at a content of 0.01 mass % to 10 mass % on the basis of the total mass of the metal particles.

2. The metal paste for joints according to claim 1, wherein a content of the monovalent aliphatic alcohol is 0.3 part by mass to 1.8 parts by mass with respect to 100 parts by mass of the metal particles.

3. The metal paste for joints according to claim 1, wherein the metal particles further comprise flake-shaped micro copper particles having a maximum diameter of 2 μm to 50 μm and an aspect ratio of greater than or equal to 3.0, a content of the sub-micro copper particles is 30 mass % to 90 mass % on the basis of a total mass of the metal particles, and a content of the micro copper particles is 10 mass % to 70 mass % on the basis of the total mass of the metal particles.

4. The metal paste for joints according to claim 1, comprising:

a solvent component at a content of 2 mass % to 50 mass % on the basis of a total mass of the metal paste for joints.

5. The metal paste for joints according to claim 4,
wherein the solvent component comprises a solvent component having a boiling point of higher than or equal to 300° C., and
a content of the solvent component having a boiling point of higher than or equal to 300° C. is 2 mass % to 50 mass % on the basis of the total mass of the metal paste for joints.

6. The metal paste for joints according to claim 5,
wherein the solvent component having a boiling point of higher than or equal to 300° C. comprises at least one type selected from the group consisting of isobornyl cyclohexanol, tributyrin, butyl stearate, and octyl octanoate.

7. The metal paste for joints according to claim 1, further comprising:
a carboxylic acid having carbon atoms of greater than or equal to 10,
wherein a content of the carboxylic acid is 0.07 part by mass to 2.10 parts by mass with respect to 100 parts by mass of the metal particles.

8. A production method for an assembly, the method comprising:
a step of preparing a laminated body in which a first member, the metal paste for joints according to claim 1, and a second member are laminated in this order, and of sintering the metal paste for joints at a temperature of lower than or equal to 250° C. in a state of receiving self-weight of the first member or in a state of receiving the self-weight of the first member and a pressure of less than or equal to 0.01 MPa.

9. A production method for a semiconductor device, the method comprising:
a step of preparing a laminated body in which a first member, the metal paste for joints according to claim 1, and a second member are laminated in this order, and of sintering the metal paste for joints at a temperature of lower than or equal to 250° C. in a state of receiving self-weight of the first member or in a state of receiving the self-weight of the first member and a pressure of less than or equal to 0.01 MPa,
wherein at least one of the first member and the second member is a semiconductor element.

10. An assembly comprising:
a first member;
a second member; and
a sintered body of the metal paste for joints according to claim 1, the sintered body joining the first member and the second member together.

11. The assembly according to claim 10,
wherein at least one of the first member and the second member comprises at least one type of metal selected from the group consisting of copper, nickel, silver, gold, and palladium, on a surface in contact with the sintered body.

12. A semiconductor device, comprising:
a first member;
a second member; and
a sintered body of the metal paste for joints according to claim 1, the sintered body joining the first member and the second member together,
wherein at least one of the first member and the second member is a semiconductor element.

13. The metal paste for joints according to claim 1,
wherein the sub-micro copper particles have been treated with a surface treatment agent.

14. The metal paste for joints according to claim 13,
wherein a treatment amount of the surface treatment agent is 0.07 to 2.10 mass % on the basis of the total mass of the sub-micro copper particles after being subjected to a surface treatment.

15. The metal paste for joints according to claim 1,
wherein the metal particles comprise at least one type of metal particles selected from the group consisting of zinc and silver at a content of 0.05 mass % to 5 mass % on the basis of the total mass of the metal particles.

16. The metal paste for joints according to claim 1,
wherein the metal particles comprise zinc particles.

17. The metal paste for joints according to claim 1,
wherein the metal particles comprise silver particles.

18. The metal paste for joints according to claim 1,
wherein the volume average particle diameter of the sub-micro copper particles is 0.15 μm to 0.6 μm.

19. The metal paste for joints according to claim 1,
wherein the volume average particle diameter of the sub-micro copper particles is 0.2 μm to 0.5 μm.

20. The metal paste for joints according to claim 1,
wherein the volume average particle diameter of the sub-micro copper particles is 0.3 μm to 0.45 μm.

* * * * *